(12) United States Patent
Do et al.

(10) Patent No.: US 11,967,607 B2
(45) Date of Patent: Apr. 23, 2024

(54) LIGHT-EMITTING DEVICE AND DISPLAY DEVICE COMPRISING SAME

(71) Applicant: SAMSUNG DISPLAY CO., LTD., Yongin-Si (KR)

(72) Inventors: Young Rag Do, Seoul (KR); Yun Jae Eo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 451 days.

(21) Appl. No.: 17/423,017

(22) PCT Filed: Jul. 15, 2019

(86) PCT No.: PCT/KR2019/008732
§ 371 (c)(1),
(2) Date: Jul. 14, 2021

(87) PCT Pub. No.: WO2020/149475
PCT Pub. Date: Jul. 23, 2020

(65) Prior Publication Data
US 2022/0077228 A1    Mar. 10, 2022

(30) Foreign Application Priority Data

Jan. 15, 2019    (KR) .................. 10-2019-0005455

(51) Int. Cl.
*H01L 27/15* (2006.01)
*H01L 33/24* (2010.01)
(Continued)

(52) U.S. Cl.
CPC ............ *H01L 27/156* (2013.01); *H01L 33/24* (2013.01); *H01L 33/38* (2013.01); *H01L 33/44* (2013.01)

(58) Field of Classification Search
CPC ............ H01L 25/0756; H01L 25/0753; H01L 25/167; H01L 27/153–156
See application file for complete search history.

(56) References Cited

U.S. PATENT DOCUMENTS 8,872,214 B2    10/2014 Negishi et al.
10,026,777 B2    7/2018 Kang et al.
(Continued)

FOREIGN PATENT DOCUMENTS

JP    2008-260073    10/2008
JP    2011-86758    4/2011
(Continued)

OTHER PUBLICATIONS

International Search Report, with English translation, corresponding to International Application No. PCT/KR2019/008732 dated Oct. 23, 2019.
(Continued)

*Primary Examiner* — Wasiul Haider
(74) *Attorney, Agent, or Firm* — KILE PARK REED & HOUTTEMAN PLLC

(57) ABSTRACT

A light emitting device may include first electrodes and second electrodes that are spaced apart from each other in a first direction, light emitting elements electrically connected between adjacent first and second electrodes among the first and the second electrodes, and a third electrode spaced apart from the first electrodes and the second electrodes. The third electrode may be electrically separated from the first electrodes and the second electrodes.

20 Claims, 19 Drawing Sheets

(51) Int. Cl.
*H01L 33/38* (2010.01)
*H01L 33/44* (2010.01)

(56) References Cited

U.S. PATENT DOCUMENTS

| | | | |
|---|---|---|---|
| 10,461,123 | B2 | 10/2019 | Kim et al. |
| 10,818,647 | B2 | 10/2020 | Kim et al. |
| 2008/0251381 | A1 | 10/2008 | Shibata et al. |
| 2011/0058126 | A1 | 3/2011 | Okada et al. |
| 2011/0089850 | A1 | 4/2011 | Shibata et al. |
| 2013/0027623 | A1* | 1/2013 | Negishi ............... H01L 25/0753 |
| | | | 438/30 |
| 2018/0012876 | A1* | 1/2018 | Kim ...................... H01L 33/387 |

FOREIGN PATENT DOCUMENTS

| | | |
|---|---|---|
| JP | 2011-86865 | 4/2011 |
| KR | 10-0955319 | 4/2010 |
| KR | 10-2018-0007025 | 1/2018 |
| KR | 10-2018-0071465 | 6/2018 |
| KR | 10-2018-0072909 | 7/2018 |
| KR | 10-2020-0088959 | 7/2020 |
| KR | 10-2020-0088960 | 7/2020 |
| KR | 10-2020-0088961 | 7/2020 |

OTHER PUBLICATIONS

Written Opinion, with English translation, corresponding to International Application No. PCT/KR2019/008732, dated Oct. 23, 2019.

* cited by examiner

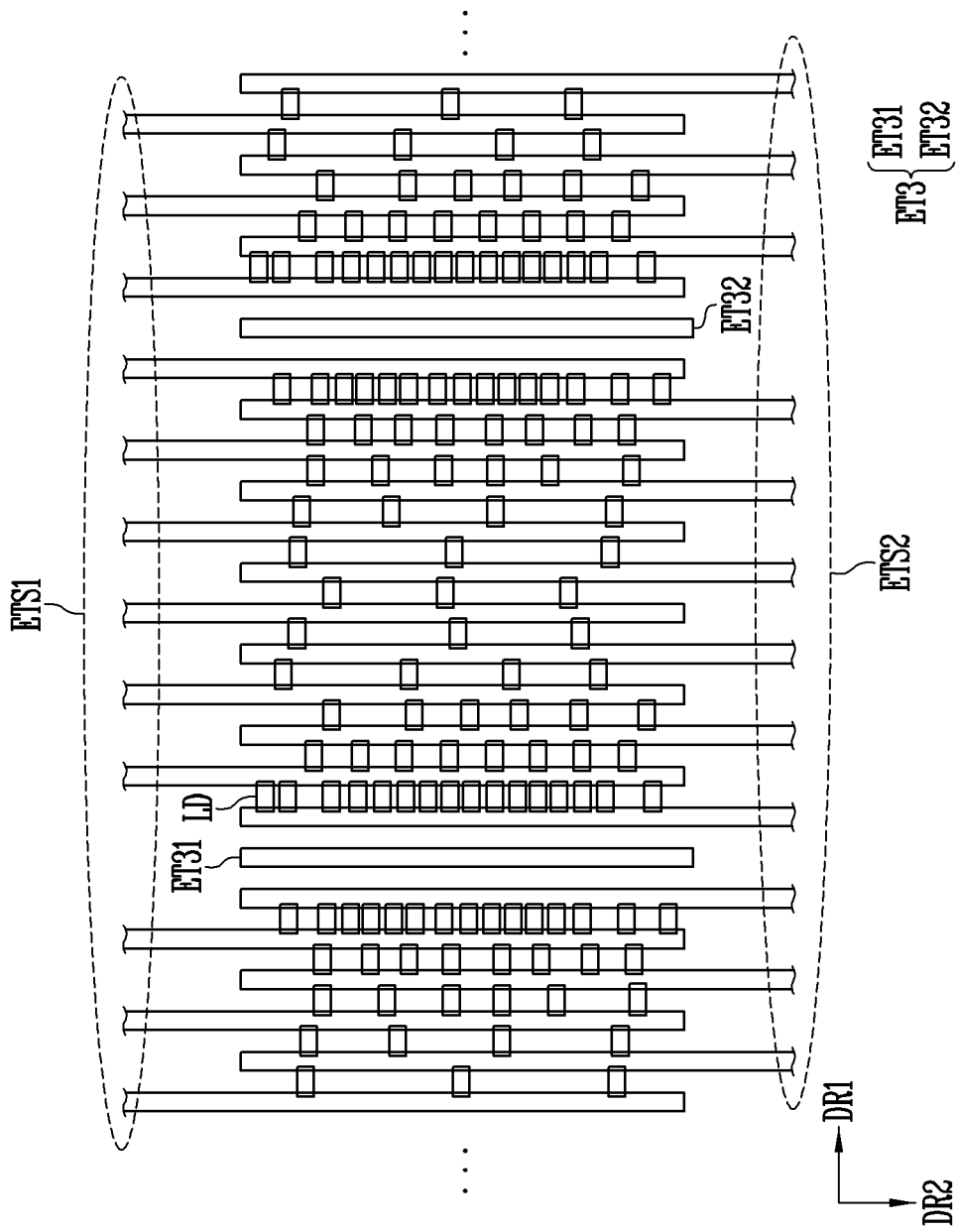

LIGHT-EMITTING DEVICE AND DISPLAY DEVICE COMPRISING SAME

CROSS-REFERENCE TO RELATED APPLICATION(S)

This application is a national entry of International Application No. PCT/KR2019/008732, filed on Jul. 15, 2019, which claims under 35 U.S.C. § 119(a) and 365(b) priority to and benefits of Korean Patent Application No. 10-2019-0005455, filed on Jan. 15, 2019 in the Korean Intellectual Property Office, the entire contents of which are incorporated herein by reference.

BACKGROUND

1. Technical Field

Various embodiments of the disclosure relate to a pixel and a display device including a light emitting device.

2. Description of the Related Art

Recently, techniques for manufacturing a subminiature light emitting element using a material having a reliable inorganic crystal structure, and for manufacturing a light emitting device using such a light emitting element have been developed. For example, a technique of fabricating a plurality of subminiature light emitting elements having a small size corresponding to a range from a nanometer scale to a micrometer scale has been developed, as has a technique for forming light sources of various light emitting devices, e.g., pixels of display devices using subminiature light emitting elements.

SUMMARY

An aspect of the disclosure may provide a light emitting device capable of controlling an alignment density of light emitting elements, and a display device including such a light emitting device.

However, aspects of the disclosure are not limited to the above, and various modifications are possible without departing from the spirit and scope of the disclosure.

A light emitting device in accordance with an embodiment of the disclosure may include first electrodes and second electrodes that are spaced apart from each other in a first direction, light emitting elements electrically connected between adjacent first and second electrodes among the first and the second electrodes, and a third electrode spaced apart from the first electrodes and the second electrodes. The third electrode may be electrically separated from the first electrodes and the second electrodes.

In an embodiment, the third electrode may be an isolated electrode.

In an embodiment, the first electrodes and the second electrodes adjacent to each other may form respective electrode pairs. A number of light emitting elements disposed on a first electrode pair most adjacent to the third electrode may be greater than the number of light emitting elements disposed on a second electrode pair disposed farther from the third electrode than the first electrode pair.

In an embodiment, a density of the light emitting elements may be reduced in a direction away from the third electrode with respect to the first direction.

In an embodiment, at least one of the first electrodes may be disposed to face a first side of the third electrode. At least another one of the first electrodes may be disposed to face a second side of the third electrode that may be opposite to the first side of the third electrode.

In an embodiment, at least one of the second electrodes may be disposed to face a first side of the third electrode. At least another one of the second electrodes may be disposed to face a second side of the third electrode that may be opposite to the first side of the third electrode.

In an embodiment, a width of the third electrode with respect to the first direction may be greater than widths of the first electrodes and the second electrodes with respect to the first direction.

In an embodiment, the third electrode may include a plurality of conductive patterns successively disposed at positions spaced apart from each other in the first direction.

In an embodiment, the first electrodes, the second electrodes, and the third electrode may be formed of an identical conductive material and be disposed on an identical insulating layer.

A display device in accordance with an embodiment of the disclosure may include a first pixel disposed in a display area and including an emission area. The first pixel may include first electrodes and second electrodes that are disposed in the emission area and spaced apart from each other in a first direction, light emitting elements electrically connected between adjacent first and second electrodes among the first and the second electrodes, a first connection electrode connected to the first electrodes, a second connection electrode connected to the second electrodes, and a third electrode electrically separated from the first electrodes and the second electrodes, and spaced apart from the first electrodes and the second electrodes.

In an embodiment, the third electrode may be an isolated electrode.

In an embodiment, the first electrodes and the second electrodes adjacent to each other may form respective electrode pairs. A number of light emitting elements disposed on a first electrode pair most adjacent to the third electrode may be greater than the number of light emitting elements disposed on a second electrode pair disposed farther from the third electrode than the first electrode pair.

In an embodiment, a density of the light emitting elements may be reduced in a direction away from the third electrode with respect to the first direction.

In an embodiment, the third electrode may be disposed in the emission area. The first and the second electrodes may be disposed in a symmetrical shape based on the third electrode.

In an embodiment, the third electrode may be disposed in the emission area. The number of the first and the second electrodes that are disposed on a first side of the third electrode differs from the number of the first and the second electrodes disposed on a second side of the third electrode.

In an embodiment, the third electrode may be disposed on a side of a non-emission area that surrounds the emission area of the first pixel.

In an embodiment, the display device may further include a bank disposed in the non-emission area to surround the first pixel, and disposed on the third electrode.

In an embodiment, the display device may further include a second pixel having a structure identical with a structure of the first pixel and disposed adjacent to the third electrode. The first connection electrodes of the first and the second pixels may be separated from each other between the first and the second pixels. The second connection electrodes of the first and the second pixels may be integrally connected with each other.

In an embodiment, a density at which the light emitting elements of each of the first and the second pixels are disposed may increase from a central portion of the corresponding emission area toward the third electrode.

In an embodiment, the first electrode, the second electrode, and the third electrode may be formed of an identical conductive material and are disposed on an identical insulating layer.

In a light emitting device and a display device including the light emitting device in accordance with embodiments of the disclosure, an area in which light emitting elements are intensively disposed in an emission area may be easily controlled by controlling a disposition position of a third electrode that floats. Therefore, a design change in the planar shape and the size of the pixel may be facilitated.

Furthermore, as the light quantity and luminance per unit surface area increases, the size of the pixel may be reduced, and a high resolution may be easily embodied.

Effects of the disclosure are not limited to the above-described effects, and various modifications are possible without departing from the spirit and scope of the disclosure.

BRIEF DESCRIPTION OF THE DRAWINGS

FIG. 9 is a plan diagram schematically illustrating a light emitting device in accordance with an embodiment of the disclosure.

DETAILED DESCRIPTION OF THE EMBODIMENTS

Figure 1A:
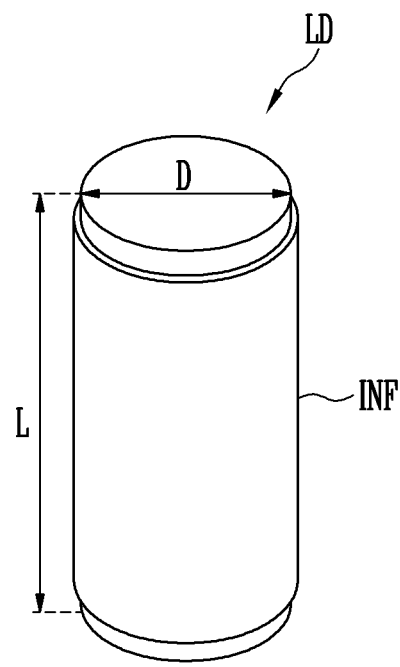
FIGS. 1A and 1B are respectively a perspective view and a sectional view schematically illustrating a light emitting element in accordance with an embodiment of the disclosure.

Various embodiments of the disclosure will hereinafter be described in detail with reference to the accompanying drawings. The same reference numerals are used throughout the different drawings to designate the same components, and repetitive description of the same components will be omitted.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. Further, it will be understood that the terms "connected to" or "coupled to" may include a physical or electrical connection or coupling.

When an element is described as "not overlapping" or "to not overlap" another element, this may include that the elements are spaced apart from each other, offset from each other, or set aside from each other or any other suitable term as would be appreciated and understood by those of ordinary skill in the art.

"About", "approximately", and "substantially", as used herein, are inclusive of the stated value and means within an acceptable range of deviation for the particular value as determined by one of ordinary skill in the art, considering the measurement in question and the error associated with measurement of the particular quantity (i.e., the limitations of the measurement system). For example, "approximately" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 1B, 2A, 2B, 3A, and 3B are perspective views and sectional views schematically illustrating light emitting elements in accordance with embodiments of the disclosure. Although FIGS. 1A to 3B illustrate cylindrical rod-type light emitting elements LD, the type and/or shape of the light emitting elements LD in accordance with the disclosure is not limited thereto.

Figure 1B:
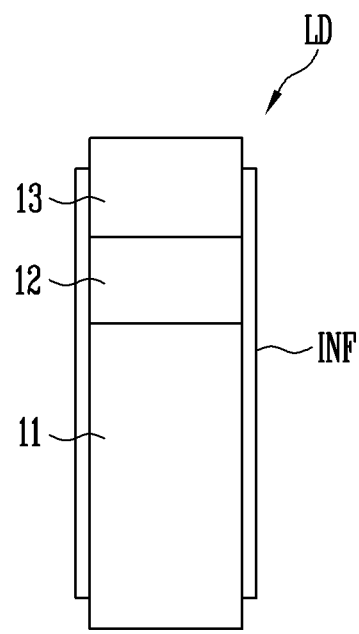

Referring to FIGS. 1A and 1B, a light emitting element LD in accordance with an embodiment of the disclosure may include a first conductive semiconductor layer 11, a second conductive semiconductor layer 13, and an active layer 12 interposed between the first and second conductive semiconductor layers 11 and 13. For example, the light emitting element LD may be configured of a stacked body formed by successively stacking the first conductive semiconductor layer 11, the active layer 12, and the second conductive semiconductor layer 13 in a longitudinal direction.

In an embodiment, the light emitting element LD may be provided in the form of a rod extending in one direction. If the direction in which the light emitting element LD extends is defined as a longitudinal direction, the light emitting element LD may have a first end and a second end with respect to the longitudinal direction.

In an embodiment, one of the first and second conductive semiconductor layers 11 and 13 may be disposed on the first end of the light emitting element LD, and the other of the first and second conductive semiconductor layers 11 and 13 may be disposed on the second end of the light emitting element LD.

In an embodiment, the light emitting element LD may be a rod-type light emitting diode manufactured in the form of a rod. The term "rod-type" embraces a rod-like shape and a bar-like shape such as a cylindrical shape and a prismatic shape extending in a longitudinal direction (e.g., to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanometer scale to the micrometer scale. Each light emitting element LD may have a diameter D and/or a length L ranging from the nanometer scale to the micrometer scale. For example, the length L of the light emitting element LD may range from approximately 100 nm to approximately 10 μm and the aspect ratio of the light emitting element LD may range from approximately 1.2 to approximately 100. However, in the disclosure, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first conductive semiconductor layer 11 may include, for example, at least one n-type semiconductor layer. For instance, the first conductive semiconductor layer 11 may include an n-type semiconductor layer which includes at least one semiconductor material of InAlGaN, GaN, AlGaN, InGaN, AlN, and InN, and may be doped with a first conductive dopant such as Si, Ge, or Sn. However, the material for forming the first conductive semiconductor layer 11 is not limited thereto, and the first conductive semiconductor layer 11 may be formed of various other materials.

The active layer 12 may be disposed on the first conductive semiconductor layer 11 and have a single or multiple quantum well structure. In an embodiment, a cladding layer (not shown) doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied to each of the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device.

The second conductive semiconductor layer 13 may be disposed on the active layer 12 and include a semiconductor layer having a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes at least one semiconductor material of InAlGaN, GaN, AlGaN, InGaN, AlN, and InN, and may be doped with a second conductive dopant such as Mg. However, the material for forming the second conductive semiconductor layer 13 is not limited thereto, and the second conductive semiconductor layer 13 may be formed of various other materials.

In an embodiment, the light emitting element LD may further include an insulating film INF provided on the surface of the light emitting element LD. The insulating film INF may be formed on the surface of the light emitting element LD to enclose an outer circumferential surface of at least the active layer 12, and may further enclose areas of the first and second conductive semiconductor layers 11 and 13. Here, the insulating film INF may allow the opposite ends of the light emitting element LD that have different polarities to be exposed to the outside. For example, the insulating film INF may expose an end of each of the first and second conductive semiconductor layers 11 and 13 that may be disposed on the respective opposite ends of the light emitting element LD with respect to the longitudinal direction, e.g., may expose two base sides of the cylinder (in FIGS. 1A and 1B, the top and bottom surfaces of the light emitting element LD) rather than covering the two base sides.

In an embodiment, the insulating film INF may include at least one insulating material of $SiO_2$, $Si_3N_4$, $Al_2O_3$, and $TiO_2$, but it is not limited thereto. In other words, the material that forms the insulating film INF is not limited to a particular material, and the insulating film INF may be formed of various insulating materials.

In an embodiment, the light emitting element LD may further include additional other components as well as the first conductive semiconductor layer 11, the active layer 12, the second conductive semiconductor layer 13, and/or the insulating film INF. For example, the light emitting element LD may further include one or more fluorescent layers, one or more active layers, one or more semiconductor layers, and/or one or more electrode layers disposed on one end of the first conductive semiconductor layer 11, the active layer 12, and/or the second conductive semiconductor layer 13.

Figure 2A:
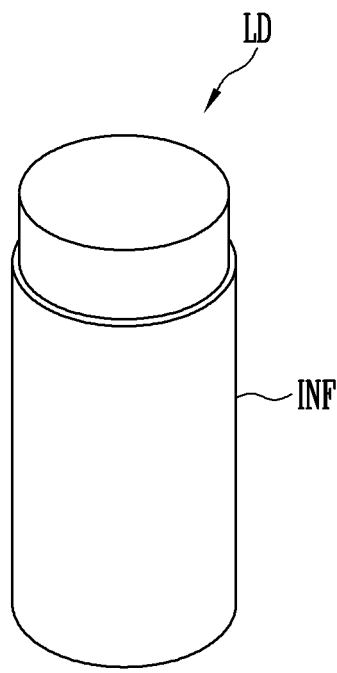
FIGS. 2A and 2B are respectively a perspective view and a sectional view schematically illustrating a light emitting element in accordance with an embodiment of the disclosure.
Figure 2B:
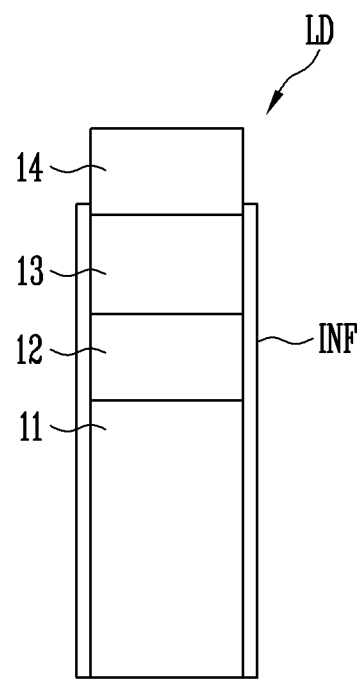
Figure 3A:
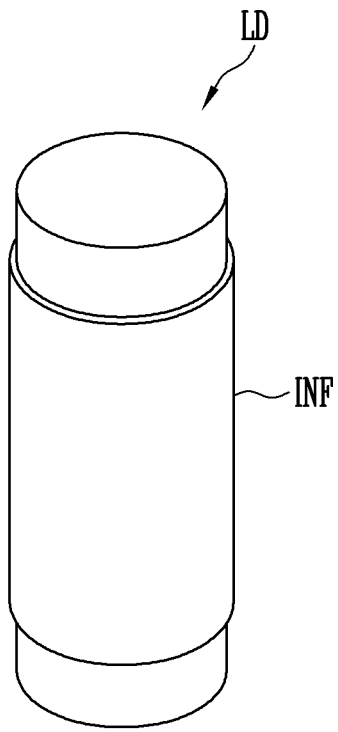
FIGS. 3A and 3B are respectively a perspective view and a sectional view schematically illustrating a light emitting element in accordance with an embodiment of the disclosure.
Figure 3B:
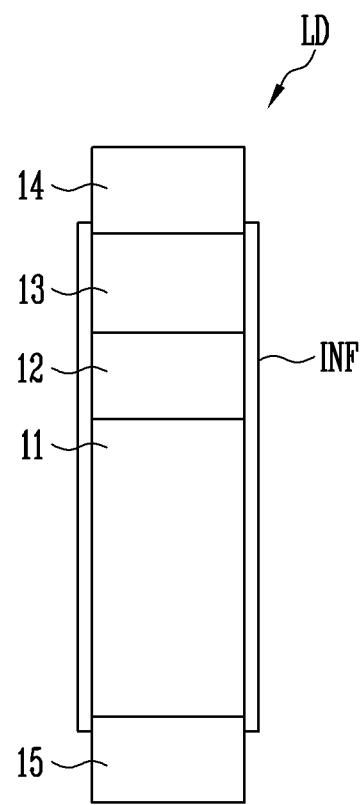

For example, as illustrated in FIGS. 2A and 2B, the light emitting element LD may further include at least one electrode layer 14 disposed on an end of the second conductive semiconductor layer 13. In an embodiment, as illustrated in FIGS. 3A and 3B, the light emitting element LD may further include at least one electrode layer 15 disposed on an end of the first conductive semiconductor layer 11.

Each of the electrode layers 14 and 15 may be an ohmic contact electrode, but it are not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination with each other. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer surfaces of the electrode layers 14 and 15, or may not enclose such outer surfaces. In other words, the insulating film INF may be selectively formed on the surfaces of the electrode layers 14 and 15. Furthermore, the insulating film INF may be formed to expose the opposite ends of the light emitting element LD that have different polarities, for example, may expose at least an area of each of the electrode layers 14 and 15. In another embodiment, the insulating film INF may not be provided.

If the insulating film INF is provided on the surface of the light emitting element LD, particularly, on the surface of the active layer 12, the active layer 12 may be prevented from short-circuiting with at least one electrode which is not shown (e.g., at least one contact electrode of contact electrodes connected to the opposite ends of the light emitting element LD), etc. Consequently, the electrical stability of the light emitting element LD may be secured.

Furthermore, thanks to the insulating film INF formed on the surface of the light emitting element LD, occurrence of a defect on the surface of the light emitting element LD may be minimized, whereby the lifetime and efficiency of the light emitting element LD may be improved. If the insulating film INF is formed on the surface of each light emitting element LD, even in case that a plurality of light emitting elements LD are disposed adjacent to each other, the light emitting elements LD may be prevented from undesirably short-circuiting.

In an embodiment of the disclosure, a surface treatment process may be performed to fabricate the light emitting element LD. For example, each light emitting element LD may be surface-treated so that, in case that a plurality of light emitting elements LD are mixed with a fluidic solution (or solvent) and supplied to each emission area (e.g., an emission area of each pixel), the light emitting elements LD can be evenly dispersed rather than unevenly aggregating in the solution.

A light emitting device including the light emitting element LD described above may be used not only in a display device but also in various devices which may require a light source. For instance, at least one subminiature light emitting element LD, e.g., a plurality of subminiature light emitting elements LD each having a size ranging from the nanometer scale to the micrometer scale, may be disposed in each pixel of the display panel to form a light source (or, a light source unit) of the pixel using the subminiature light emitting elements LD. Furthermore, the field of application of the light emitting element LD according to the disclosure is not limited to a display device. For example, the light emitting element LD may also be used in other types of devices such as a lighting device, which may require a light source.

Figure 4:
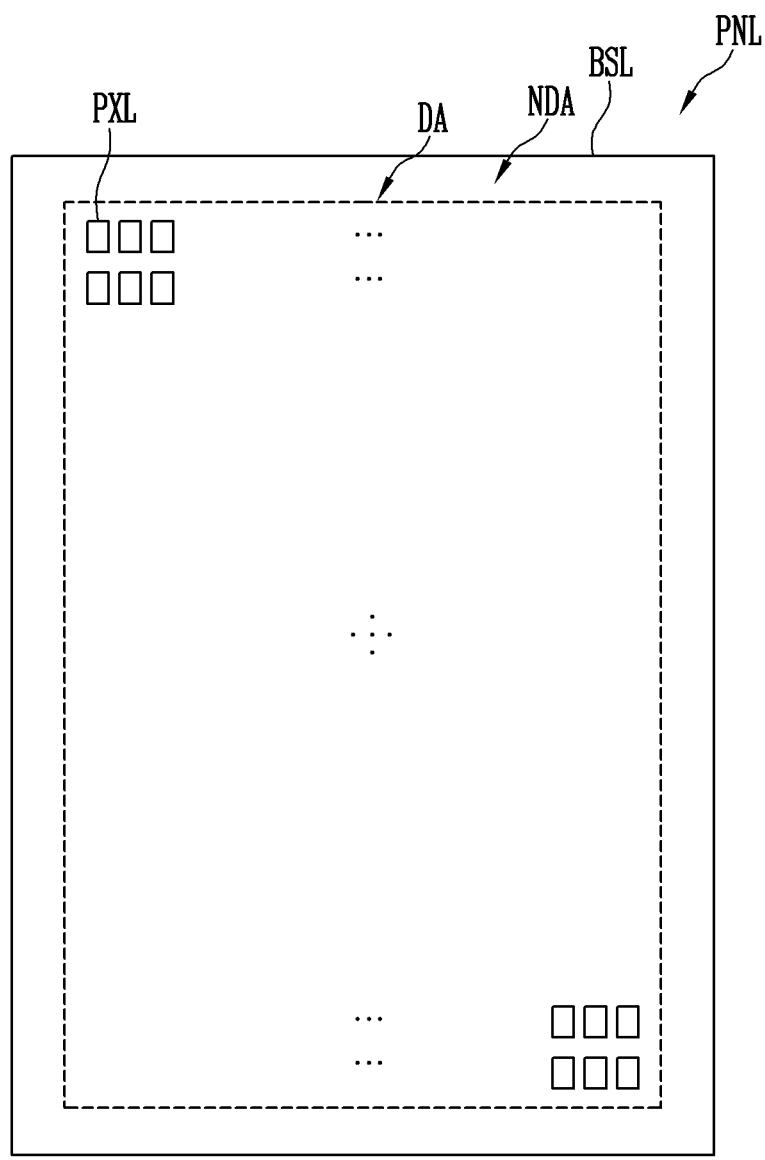
FIG. 4 is a plan view schematically illustrating a display device in accordance with an embodiment of the disclosure.

FIG. 4 is a plan view schematically illustrating a display device in accordance with an embodiment of the disclosure. FIG. 4 illustrates a display device, particularly, a display panel PNL provided in the display device, as an example of a device which may use, as a light source, the light emitting element LD described with reference to FIGS. 1A to 3B. For example, the pixels PXL of the display panel PNL may have at least one light emitting element LD.

For the sake of explanation, FIG. 4 simply illustrates the structure of the display panel PNL in accordance with an embodiment, focused on a display area DA. In some embodiments, although not illustrated, at least one driving circuit (e.g., at least one of a scan driver and a data driver) and/or a plurality of lines may be further provided on the display panel PNL.

Referring to FIG. 4, the display panel PNL in accordance with an embodiment of the disclosure may include a base layer BSL, and pixels PXL disposed on the base layer BSL. In detail, the display panel PNL and the base layer BSL for forming the display panel PNL may include a display area DA for displaying an image, and a non-display area NDA formed in an area other than the display area DA. The pixels PXL may be disposed in the display area DA on the base layer BSL.

In an embodiment, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited thereto, and the locations thereof may be changed. The display area DA may form a screen on which an image may be displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

An area on the base layer BSL may be defined as the display area DA in which the pixels PXL may be disposed, and another area thereof may be defined as the non-display area NDA. For example, the base layer BSL may include the display area DA in which the pixels PXL may be formed, and the non-display area NDA disposed around the display area DA. Various lines and/or internal circuits which may be connected to the pixels PXL of the display area DA may be disposed in the non-display area NDA.

In an embodiment, the pixels PXL may be distributed and arranged in the display area DA. In an embodiment, the pixels PXL may be arranged in the display area DA in a stripe or PenTile® arrangement manner. However, the disclosure is not limited thereto. For example, the pixels PXL may be arranged in the display area DA in various arrangement manners.

Each pixel PXL may include at least one light source, which may be driven by a control signal (e.g., a scan signal and a data signal) and/or power voltage (e.g., first and second power voltage), for example, a light emitting element LD according to any one of the embodiments of FIGS. 1A to 3B. For example, each pixel PXL may include at least one subminiature light emitting element LD having a small size ranging from the nanometer scale to the micrometer scale. For example, each pixel PXL may include subminiature light emitting elements which are connected parallel to each other between pixel electrodes and/or power lines and form a light source or a light source unit of the corresponding pixel PXL, and each of which may have a rod-like shape.

In an embodiment, each pixel PXL may be formed of an active pixel. However, the types, structures, and/or driving schemes of the pixels PXL capable of being applied to the display device according to the disclosure are not particularly limited. For example, each pixel PXL may have the same structure as that of a pixel for passive or active light emitting display devices which have various structures and/or may be operated in various driving schemes.

Figure 5A:
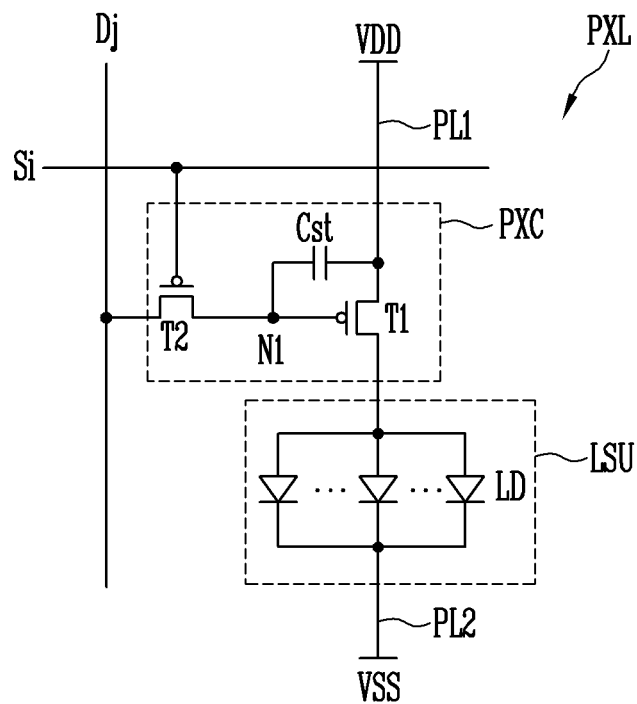
FIGS. 5A, 5B, and 5C are circuit diagrams each schematically illustrating a pixel in accordance with an embodiment of the disclosure.
Figure 5B:
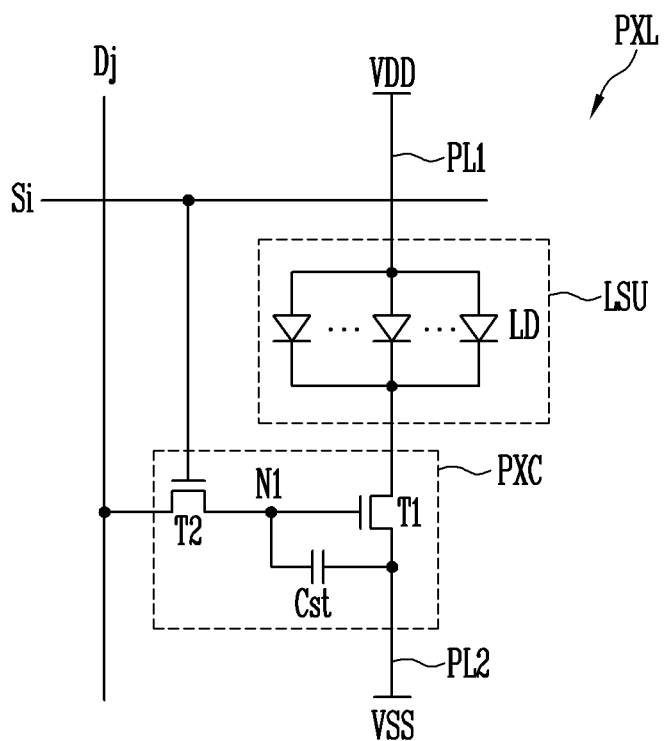
Figure 5C:
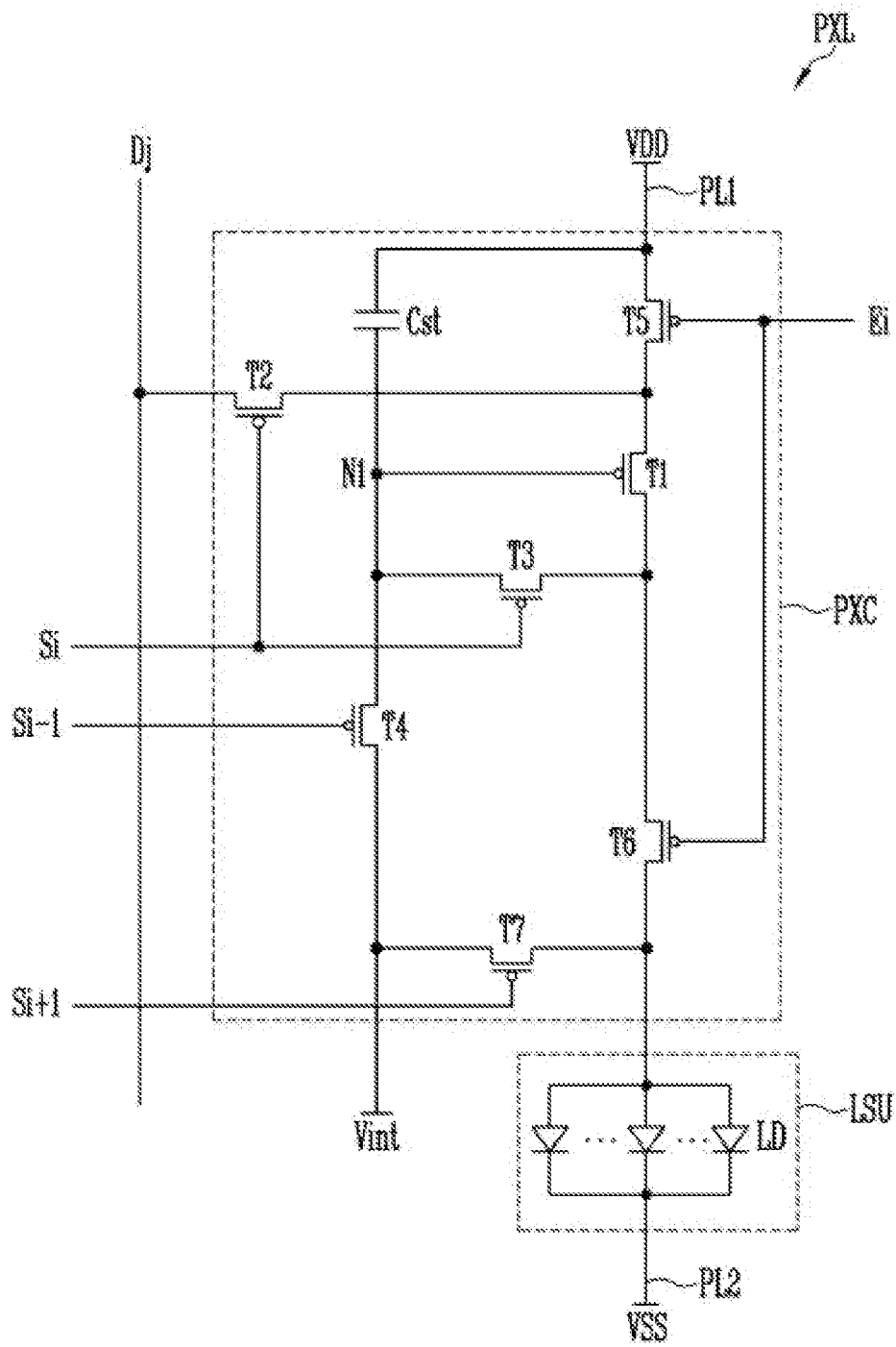

FIGS. 5A, 5B, and 5C are circuit diagrams schematically illustrating a pixel in accordance with an embodiment of the disclosure, and for example illustrate different embodiments of an active pixel PXL that forms each light emitting device. In an embodiment, each pixel PXL illustrated in FIGS. 5A, 5B, and 5C may be any one of the pixels PXL provided on the display panel PNL of FIG. 4. The pixels PXL may have substantially the same or similar structure.

Referring to FIG. 5A, the pixel PXL in accordance with an embodiment of the disclosure may include a light source unit LSU that generates light having a luminance corresponding to a data signal. The pixel PXL may further include a pixel circuit PXC that drives the light source unit LSU.

In an embodiment, the light source unit LSU may include light emitting elements LD that may be electrically connected to each other between the first power supply VDD and the second power supply VSS. In an embodiment, the light emitting elements LD may be connected parallel to each other, but the disclosure is not limited thereto. For example, in an embodiment, light emitting elements LD may be connected in a serial/parallel combination structure between the first power supply VDD and the second power supply VSS.

In an embodiment, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the pixel PXL.

Although FIG. 5A illustrates an embodiment in which the light emitting elements LD forming the light source unit LSU of each pixel PXL are connected in parallel to each other in the same direction (e.g., in a forward direction) between the first power supply VDD and the second power supply VSS, the disclosure is not limited thereto. For example, in an embodiment, some of the light emitting elements LD may be connected to each other in a first direction (e.g., the forward direction) between the first and second power supplies VDD and VSS, and other light emitting elements LD may be connected to each other in a second direction (e.g., a reverse direction). In another embodiment, at least one pixel PXL may include only a single light emitting element LD (e.g., a single valid light emitting element connected in the forward direction between the first and second power supplies VDD and VSS).

In an embodiment, first ends of the light emitting elements LD forming each light source unit LSU may be connected in common to the pixel circuit PXC through an electrode of the light source unit LSU (e.g., a first electrode and/or a first contact electrode of each pixel PXL), and may be connected to the first power supply VDD through the pixel circuit PXC and a first power line PL1. Second ends of the light emitting elements LD may be connected in common to the second power supply VSS through another electrode of the light source unit LSU (e.g., a second electrode and/or a second contact electrode of each pixel PXL) and the second power line PL2.

Each light source unit LSU may emit light having a luminance corresponding to driving current supplied thereto through the corresponding pixel circuit PXC. Thereby, an image may be displayed on the display area DA.

The pixel circuit PXC may be connected to a scan line Si and a data line Dj of the corresponding pixel PXL. For example, if the pixel PXL is disposed on an i-th row (i may be a natural number) and a j-th column (j may be a natural number) of the display area DA, the pixel circuit PXC of the pixel PXL may be connected to an i-th scan line Si and a j-th data line Dj of the display area DA. In an embodiment, the pixel circuit PXC may include first and second transistors T1 and T2, and a storage capacitor Cst.

The first transistor (referred to also as "driving transistor") T1 may be connected between the first power supply VDD and the light source unit LSU. A gate electrode of the first transistor T1 may be connected to a first node N1. The first transistor T1 may control driving current to be supplied to the light source unit LSU in response to the voltage of the first node N1.

The second transistor (referred to also as "switching transistor") T2 may be connected between the data line Dj and the first node N1. A gate electrode of the second transistor T2 may be connected to the scan line Si. In case that a scan signal having a gate-on voltage (e.g., a low level voltage) is supplied from the scan line Si, the second transistor T2 may be turned on to electrically couple the first node N1 to the data line Dj.

During each frame period, a data signal of a corresponding frame may be supplied to the data line Dj. The data signal may be transmitted to the first node N1 via the second transistor T2. Thereby, a voltage corresponding to the data signal may be charged to the storage capacitor Cst.

An electrode of the storage capacitor Cst may be connected to the first power supply VDD, and another electrode thereof may be connected to the first node N1. The storage capacitor Cst may charge a voltage corresponding to a data signal to be supplied to the first node N1 during each frame period.

Although in FIG. 5A the transistors, e.g., the first and second transistors T1 and T2, included in the pixel circuit PXC have been illustrated as being formed of P-type transistors, the disclosure is not limited thereto. In other words, at least one of the first and second transistors T1 and T2 may be changed to an N-type transistor.

For example, as shown in FIG. 5B, both the first and second transistors T1 and T2 may be formed of N-type transistors. The gate-on voltage of the scan signal for writing the data signal supplied to the data line Dj in each frame period to the pixel PXL may be a high level voltage. Likewise, the voltage of the data signal for turning on the first transistor T1 may be a voltage having a waveform opposite to that of the embodiment of FIG. 5A. For example, in the embodiment of FIG. 5B, as a gray scale value that is to be expressed increases, a data signal having a higher voltage may be supplied.

The pixel PXL shown in FIG. 5B may be substantially similar in configuration and operation to the pixel PXL of FIG. 5A, except that the connection positions of some circuit elements and the voltage levels of control signals (e.g., a scan signal and a data signal) may be changed depending on a change in type of the transistor. Therefore, detailed description of the pixel PXL of FIG. 5B will be omitted.

The structure of the pixel circuit PXC is not limited to the embodiments shown in FIGS. 5A and 5B. In other words, the pixel circuit PXC may be formed of a pixel circuit which may have various structures and/or be operated by various driving schemes. For example, the pixel circuit PXC may be configured in the same manner as that of an embodiment illustrated in FIG. 5C.

Referring to FIG. 5C, the pixel circuit PXC may be connected not only to a scan line Si of a corresponding horizontal line but also to at least one additional (e.g., another) scan line (or a control line). For example, the pixel circuit PXC of the pixel PXL disposed on the i-th row of the display area DA may be further connected to an i−1-th scan line Si−1 and/or an i+1-th scan line Si+1. In an embodiment, the pixel circuit PXC may be connected not only to the first and second power supplies VDD and VSS but also to a third power supply. For instance, the pixel circuit PXC may also be connected to an initialization power supply Vint. In an embodiment, the pixel circuit PXC may include first to seventh transistors T1 to T7 and a storage capacitor Cst.

The first transistor T1 may be connected between the first power supply VDD and the light source unit LSU. For example, a first electrode (e.g., a source electrode) of the first transistor T1 may be connected to the first power supply VDD through the fifth transistor T5 and the first power line PL1, and a second electrode (e.g., a drain electrode) of the first transistor T1 may be connected via the sixth transistor T6 to the first electrode of the light source unit LSU (e.g., the first electrode and/or the first contact electrode of the corresponding pixel PXL). A gate electrode of the first transistor T1 may be connected to a first node N1. The first transistor T1 may control driving current to be supplied to the light source unit LSU in response to the voltage of the first node N1.

The second transistor T2 may be connected between the data line Dj and the first electrode of the first transistor T1. A gate electrode of the second transistor T2 may be connected to the corresponding scan line Si. In case that a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be connected between another electrode of the first transistor T1 and the first node N1. A gate electrode of the third transistor T3 may be connected to the corresponding scan line Si. In case that a scan signal having a gate-on voltage is supplied from the scan line Si, the third transistor T3 may be turned on to electrically connect the first transistor T1 in the form of a diode.

The fourth transistor T4 may be connected between the first node N1 and the initialization power supply Vint. A gate electrode of the fourth transistor T4 may be connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. In an embodiment, in case that the first transistor T1 is a P-type transistor, the voltage of the initialization power supply Vint for initializing the gate voltage of the first transistor T1 may be the lowest voltage of the data signal or less.

The fifth transistor T5 may be connected between the first power supply VDD and the first transistor T1. A gate electrode of the fifth transistor T5 may be connected to a corresponding emission control line, e.g., an i-th emission control line Ei. The fifth transistor T5 may be turned off in case that an emission control signal having a gate-off voltage (e.g., a high level voltage) is supplied to the emission control line Ei, and may be turned on in other cases.

The sixth transistor T6 may be connected between the first transistor T1 and the light source unit LSU. A gate electrode of the sixth transistor T6 may be connected to a corresponding emission control line, e.g., the i-th emission control line Ei. The sixth transistor T6 may be turned off in case that an emission control signal having a gate-off voltage is supplied to the emission control line Ei, and may be turned on in other cases.

The seventh transistor T7 may be connected between the first electrode of the light source unit LSU (e.g., the first electrode and/or the first contact electrode of the corresponding pixel PXL) and the initialization power supply Vint. A gate electrode of the seventh transistor T7 may be connected to any one of the scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU. During each initialization period in which the voltage of the initialization power supply Vint may be transmitted to the light source unit LSU, the voltage of the first electrode of the light source unit LSU may be initialized. The control signal for controlling the operation of the seventh transistor T7 may be changed in various ways. For example, in an embodiment, the gate electrode of the seventh transistor T7 may be connected to a scan line of a corresponding horizontal line, e.g., an i-th scan line Si. In case that a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage corresponding both to the data signal applied to the first node N1 during each frame period and to the threshold voltage of the first transistor T1.

Although in FIG. 5C the transistors, e.g., the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

The structure of the pixel PXL which may be applied to the disclosure is not limited to the embodiments illustrated in FIGS. 5A to 5C, and each pixel PXL may have various structures. For example, the pixel circuit PXC included in each pixel PXL may be formed of a pixel circuit which may have various structures and/or be operated by various driving schemes. In an embodiment of the disclosure, each pixel PXL may be configured in a passive light emitting display device, or the like. The pixel circuit PXC may be omitted, and each of the opposite ends of the light emitting elements LD that constitute the light source unit LSU may be directly connected to the scan line Si, the data line Dj, a power line, and/or the control line.

Figure 6:
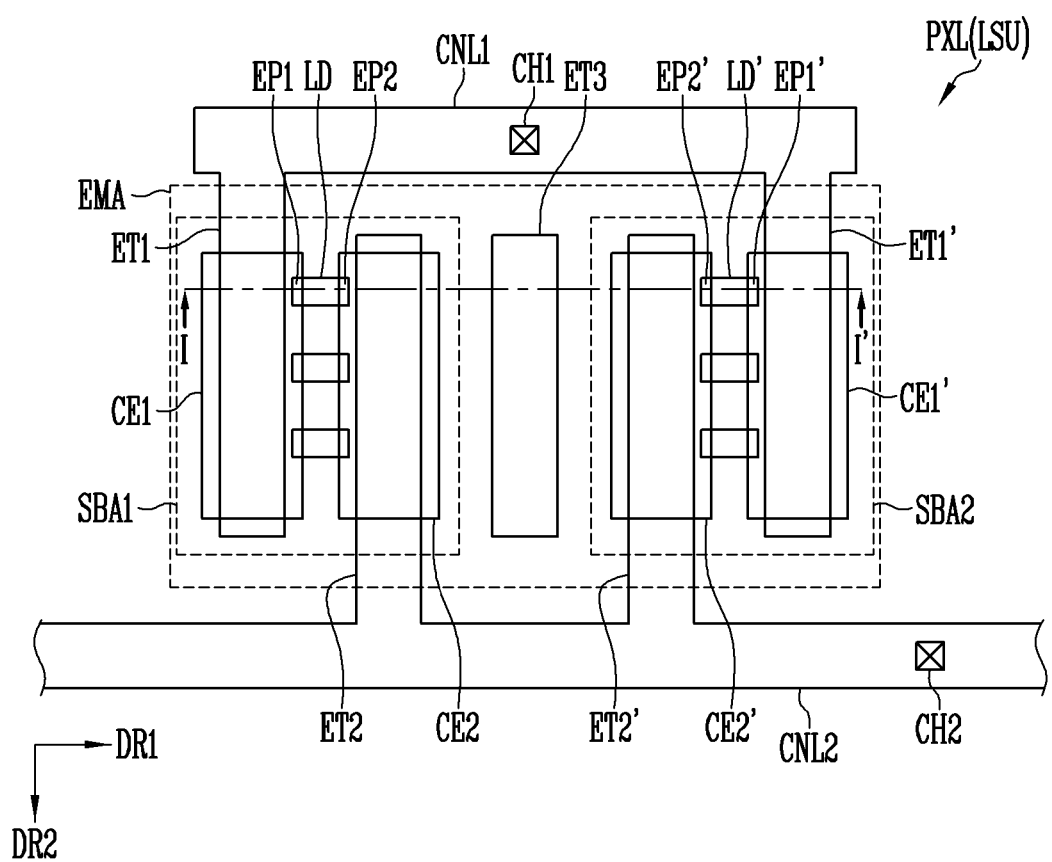
FIG. 6 is a plan view schematically illustrating a light emitting device in accordance with an embodiment of the disclosure, and for example schematically illustrates an embodiment of a pixel which forms the light emitting device.
Figure 7:
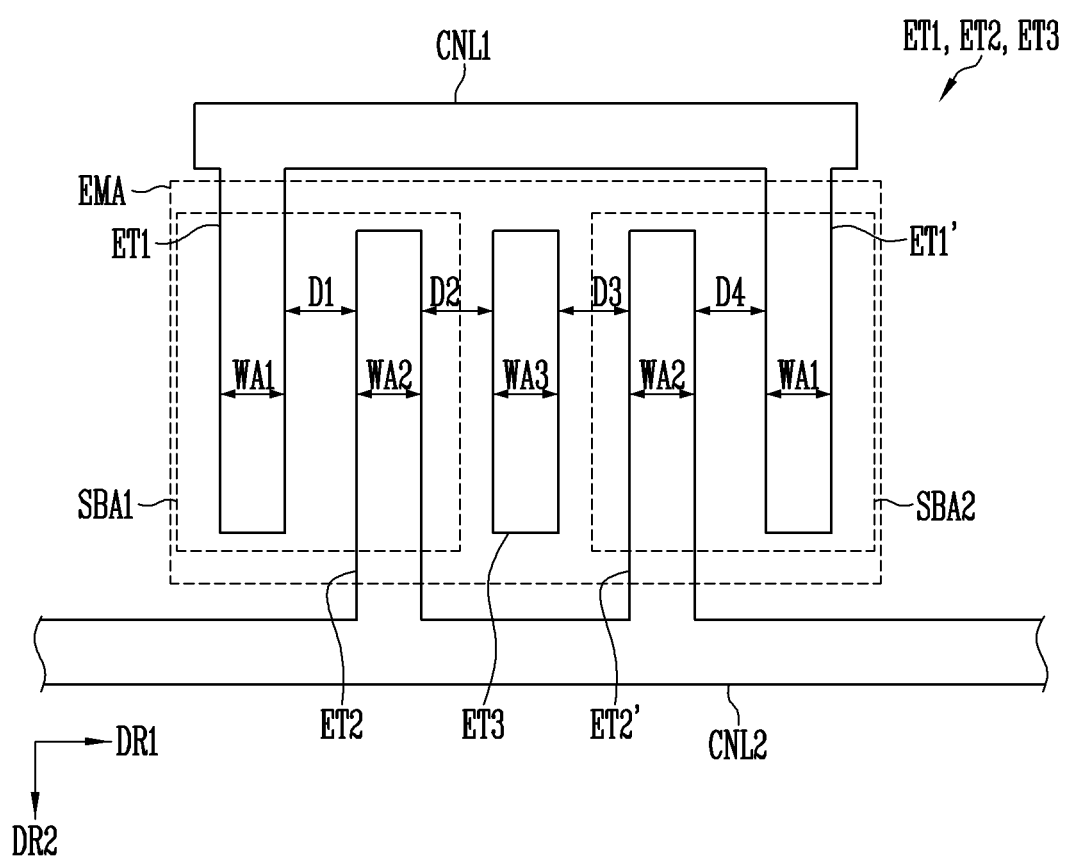
FIG. 7 is a plan view schematically illustrating an example of first to third electrodes of FIG. 6.

FIG. 6 is a plan view schematically illustrating a light emitting device in accordance with an embodiment of the disclosure, and for example illustrates an embodiment of a pixel which forms the light emitting device. FIG. 7 is a plan view schematically illustrating an example of first to third electrodes of FIG. 6.

In an embodiment, the pixel PXL may be any one of the pixels PXL illustrated in FIGS. 4 to 5C, but the disclosure is not limited thereto.

FIGS. 6 and 7 illustrate only the structure of a display element layer on which a light source unit LSU (or "light emitting device") of each pixel PXL may be disposed. Here, the pixel PXL may selectively further include a circuit element (e.g., at least one circuit element that forms the pixel circuit PXC of FIGS. 5A to 5C) for controlling each light source unit LSU. FIG. 6 illustrates a case where each light source unit LSU may be connected through first and second contact holes CH1 and CH2 to a power line (e.g., first and/or second power lines PL1 and/or PL2), a circuit element (e.g., at least one circuit element that forms the pixel circuit PXC), and/or a signal line (e.g., a scan line Si and/or a data line Dj), but the disclosure is not limited thereto. For example, in an embodiment of the disclosure, at least one of the first and second electrodes ET1, ET1', ET2, and ET2' may be directly connected to a power line and/or signal line without passing through a contact hole and/or an intermediate line.

Referring to FIGS. 6 and 7, a light emitting device included in the pixel PXL or the like may include an emission area EMA, first electrodes ET1 and ET1', second electrode ET2 and ET2', and a third electrode ET3, which are disposed in the emission area EMA, and first and second contact electrodes CE1, CE1', CE2, and CE2' which respectively overlap the first and second electrodes ET1, ET1', ET2, and ET2'. The first and second electrodes ET1, ET1', ET2, and ET2' may be disposed at positions spaced apart from each other in the emission area EMA. Likewise, the first and second contact electrodes CE1, CE1', CE2, and CE2' may also be disposed at positions spaced apart from each other in the emission area EMA.

Furthermore, the pixel PXL may include light emitting elements LD and LD' which may be electrically connected between the adjacent first and second electrodes ET1, ET1', ET2, and ET2' and the adjacent first and second contact electrodes CE1, CE1', CE2, and CE2'.

The emission area EMA may include, based on the third electrode ET3, a first sub-area SBA1 including the first and second electrodes ET1 and ET2, and a second sub-area SBA2 including the first and second electrodes ET1' and ET2'. In an embodiment, configurations included in the second sub-area SBA2 may be substantially the same as configurations included in the first sub-area SBA1. Furthermore, based on the third electrode ET3, the configurations included in the second sub-area SBA2 may be substantially symmetrical with the configurations included in the first sub-area SBA1. For the sake of explanation, hereinafter, some configurations of the pixel PXL will be described, centered on the configurations of the first sub-area SBA1.

The first ends EP1 of at least some of the light emitting elements LD each may be electrically connected to the first electrode ET1 and the first contact electrode CE1. The second ends EP2 of the at least some of the light emitting elements LD each may be electrically connected to the second electrode ET2 and the second contact electrode CE2. As such, each of a plurality of light emitting elements LD (referred to also as "valid light emitting elements") that are electrically connected between the first and second electrodes ET1 and ET2 and between the first and second contact electrodes CE1 and CE2 (particularly, connected in the forward direction to emit light in response to a control signal and/or power supplied to the first and/or second electrodes ET1 and/or ET2) may form a light source of the corresponding pixel PXL. Such valid light emitting elements LD may be collected to form the light source unit LSU of the corresponding pixel PXL.

The pixel PXL may selectively further include a first bank pattern PW1 (see FIG. 8A) and a second bank pattern PW2 (see FIG. 8A) which may be respectively disposed to overlap the first electrode ET1 and the second electrode ET2. In an embodiment, the first bank pattern PW1 and the second bank pattern PW2 may be respectively disposed under the first electrode ET1 and the second electrode ET2.

The emission area EMA may be an area on which light emitting elements LD (particularly, valid light emitting elements completely connected between the first and second electrodes ET1 and ET2) that form the light source unit LSU of the pixel PXL may be disposed. The emission area EMA may be surrounded by a light shielding or reflective bank (referred to also as "pixel defining layer"), which is not illustrated.

The first electrode ET1 and the second electrode ET2 may be disposed in the first sub-area SBA1 at positions spaced apart from each other such that at least areas thereof face each other. For example, the first and second electrodes ET1 and ET2 may be disposed at positions spaced apart from each other in the first direction DR1. Furthermore, although FIG. 6 illustrates that one first electrode ET1 and one second electrode ET2 are disposed in the first sub-area SBA1, this is only for illustrative purposes, and a plurality of first and second electrodes ET1 and ET2 may be alternately disposed in the first sub-area SBA1.

In an embodiment, in the emission area EMA, the first and second electrodes ET1 and ET2 may extend in the second direction DR2 and be disposed parallel to each other. The first direction DR1 and the second direction DR2 may be perpendicular to each other, but the disclosure is not limited thereto. For example, in an embodiment, the first direction DR1 and the second direction DR2 may intersect with each other in a diagonal direction.

In an embodiment, the first electrode ET1 may be connected to a first connection electrode CNL1 adjacent to the emission area EMA. In an embodiment, the first electrode ET1 and the first connection electrode CNL1 may be integrally connected with each other, but the disclosure is not limited thereto. In the case where the first electrode ET1 and the first connection electrode CNL1 are integrally connected to each other, they may be regarded as a single electrode. In an embodiment, the first connection electrode CNL1 may extend in the first direction DR1.

The first electrode ET1 may be electrically connected to a circuit element (e.g., at least one transistor that forms the pixel circuit PXC), a power line (e.g., the first power line PL1), and/or a signal line (e.g., a scan line Si, a data line Dj, or a control line) through a first connection electrode CNL1 and/or a first contact hole CH1. For example, the first electrode ET1 may be electrically connected to a circuit element disposed thereunder through the first connection electrode CNL1 and the first contact hole CH1, and be electrically connected to a first line through the circuit element. In an embodiment, the first line may be the first power line PL1 for supply of the first power supply VDD, but the disclosure is not limited thereto. For example, in an embodiment, the first line may be a signal line through which a first driving signal (e.g., a scan signal, a data signal, or a control signal) may be supplied.

In another embodiment, the first electrode ET1 may be directly connected to a power line or signal line without passing through the first connection electrode CNL1, the first contact hole CH1, and/or the circuit element. The first electrode ET1 may be integrally or non-integrally connected to the power line or the signal line.

In an embodiment, the second electrode ET2 may be connected to a second connection electrode CNL2 adjacent to the emission area EMA. The second electrode ET2 and the second connection electrode CNL2 may be integrally connected with each other, but the disclosure is not limited thereto. In the case where the second electrode ET2 and the second connection electrode CNL2 are integrally connected to each other, they may be regarded as a single electrode.

In an embodiment, the second connection electrode CNL2 may extend in the first direction DR1 and be disposed substantially parallel with the first connection electrode CNL1.

The second electrode ET2 may be electrically connected to a circuit element (e.g., at least one transistor that forms the pixel circuit PXC), a power line (e.g., the second power line PL2), and/or a signal line (e.g., a scan line Si, a data line Dj, or a control line) through the second connection electrode CNL2 and/or a second contact hole CH2. For example, the second electrode ET2 may be electrically connected, through the second connection electrode CNL2 and the second contact hole CH2, to a second line disposed thereunder. In an embodiment, the second line may be the second power line PL2 for supply of the second power supply VSS, but the disclosure is not limited thereto. For example, in an embodiment, the second line may be a signal line through which a second driving signal (e.g., a scan signal, a data signal, or a control signal) may be supplied.

In another embodiment, the second electrode ET2 may be directly connected to a power line or signal line without passing through the second connection electrode CNL2, the second contact hole CH2, and/or the circuit element. The second electrode ET2 may be integrally or non-integrally connected to the power line or the signal line.

In an embodiment, during a process of forming the pixel PXL, particularly, before the alignment of the light emitting elements LD may be completed, the respective first electrodes ET1 of the pixels PXL disposed on the display area DA may be electrically connected to each other, and the respective second electrodes ET2 may be electrically connected to each other. The first and second electrodes ET1 and ET2 may be respectively supplied with a first alignment voltage and a second alignment voltage at the step of aligning the light emitting elements LD. In other words, at the step of aligning the light emitting elements LD, an alignment signal may be applied between the first and second electrodes ET1 and ET2, so that an electric field can be formed between the first and second electrodes ET1 and ET2. The light emitting elements LD supplied to each pixel, particularly, the emission area EMA of each pixel PXL, may be aligned between the first and second electrodes ET1 and ET2 by the electric field. After the alignment of the light emitting elements LD has been completed, connection between the first electrodes ET1 and/or connection between the second electrodes ET2 may be disconnected between the pixels PXL so that the pixels PXL can be individually driven.

The third electrode ET3 may not be electrically connected with the first electrodes ET1 and the second electrode ET2. In an embodiment, the third electrode ET3 may be disposed in the form of an isolated shape (e.g., island shape (or referred also as to "floating state" or "open state")). For example, the third electrode ET3 may be a dummy electrode through which current may not flow, and be spaced apart from the first and second electrodes ET1 and ET2.

For example, the third electrode ET3 may be disposed in the emission area EMA and separate the first sub-area SBA1 and the second sub-area SBA2 from each other. A light emitting element that physically comes into contact with an open third electrode ET3 may not emit light because current may not flow therethrough. Although FIG. 6 illustrates that the third electrode ET3 is not connected with a light emitting element, light emitting elements which do not emit light may be substantially disposed on the third electrode ET3. In other words, FIG. 6 illustrates only valid light emitting elements.

In an embodiment, the third electrode ET3 may extend in the second direction DR2 and be disposed substantially parallel to the first and second electrodes ET1 and ET2. In an embodiment, the third electrode ET3 may have a shape formed by cutting off a portion of the first electrode ET1 or the second electrode ET2.

For example, the third electrode ET3 may be formed through the same process as that of the first electrode ET1 or the second electrode ET2. In other words, the third electrode ET3 may be formed by patterning the first and second electrodes ET1 and ET2 such that selected some of the first and second electrodes ET1 and ET2 float.

During a process of applying the first alignment voltage and the second alignment voltage for alignment of the light emitting elements LD, a voltage may not be applied to the third electrode ET3 that floats, so that the third electrode ET3 does not form an electric field. Hence, rather than being aligned or guided toward the third electrode ET3, the light emitting elements LD may move to other electrodes disposed around the third electrode ET3. Thus, the arrangement of the light emitting elements LD may be focused on an electrode pair including the first and second electrodes ET1 and ET2 adjacent to the third electrode ET3.

In an embodiment, widths WA1, WA2, and WA3 of the first to third electrodes ET1, ET2, and ET3 with respect to the first direction DR1 may be substantially the same as each other. However, this is only for illustrative purposes, and at least some of the widths WA1, WA2, and WA3 of the first to third electrodes ET1, ET2, and ET3 may differ from each other. For example, the width WA3 of the third electrode ET3 may be greater than the widths WA1 and WA2 of the first and second electrodes ET1 and ET2.

In an embodiment, respective distances D1, D2, D3, and D4 between the adjacent first to third electrodes ET1, ET2, and ET3 may be substantially the same as each other. However, this is only for illustrative purposes, and at least some of the distances D1, D2, D3, and D4 between the adjacent first to third electrodes ET1, ET2, and ET3 may differ from each other.

The respective widths WA1, WA2, and WA3 of the electrodes and the distances D1, D2, D3, and D4 between the electrodes may be changed in various ways depending on a desired alignment density of the light emitting elements LD.

The first contact electrode CE1 may be disposed over the first electrode ET1 to overlap the first electrode ET1. In an embodiment, the first electrode ET1 and the first contact electrode CE1 may have shapes corresponding to each other.

In an embodiment, the first contact electrode CE1 may be disposed on one area of the first electrode ET1 and the first ends EP1 of a plurality of light emitting elements LD aligned in the emission area EMA, and be electrically connected to the first ends EP1 and the first electrode ET1. The first ends EP1 of the light emitting elements LD may be electrically connected to the first electrode ET1 by the first contact electrode CE1. Furthermore, the first ends EP1 of the light emitting elements LD may be stably fixed by the first contact electrode CE1, so that the light emitting elements LD may be prevented from being removed from the aligned positions.

The second contact electrode CE2 may be disposed over the second electrode ET2 to overlap the second electrode ET2. In an embodiment, the second electrode ET2 and the second contact electrode CE2 may have shapes corresponding to each other.

In an embodiment, the second contact electrode CE2 may be disposed on at least one area of the second electrode ET2 and the second ends EP2 of a plurality of light emitting elements LD aligned in the emission area EMA, and be electrically connected to the second ends EP2 and the second electrode ET2. The second ends EP2 of the light emitting elements LD may be electrically connected to the second electrode ET2 by the second contact electrode CE2. Furthermore, the second ends EP2 of the light emitting elements LD may be stably fixed by the second contact electrode CE2, so that the light emitting elements LD may be prevented from being removed from the aligned positions.

The light emitting elements LD may be aligned between the first and second electrodes ET1 and ET2. The first ends EP1 of the light emitting elements LD may be electrically connected to the first electrode ET1, and the second ends EP2 thereof are electrically connected to the second electrode ET2. For example, the first ends EP1 of the light emitting elements LD may overlap the first contact electrode CE1 and thus be electrically connected to the first contact electrode CE1, and may be electrically connected to the first electrode ET1 through the first contact electrode CE1. Likewise, the second ends EP2 of the light emitting elements LD may overlap the second contact electrode CE2 and thus be electrically connected to the second contact electrode CE2, and may be electrically connected to the second electrode ET2 through the second contact electrode CE2.

In an embodiment, each light emitting element LD may be a rod-type light emitting element having a longitudinal direction. Furthermore, the light emitting element LD may include a first end EP1 which may be disposed on an end thereof with respect to the longitudinal direction and electrically connected to the first electrode ET1, and a second end EP2 which may be disposed on another end thereof with respect to the longitudinal direction and electrically connected to the second electrode ET2. For example, each light emitting element LD may be electrically connected between the first and second electrodes ET1 and ET2, in an area in which the first and second electrodes ET1 and ET2 may be disposed to face each other.

In an embodiment, each light emitting element LD may be a light emitting element which may be made of material having an inorganic crystal structure and have a subminiature size, e.g., ranging from the nanometer scale to the micrometer scale. For example, each light emitting element LD may be a subminiature rod-type light emitting element which has a diameter D and/or a length L ranging from the nanometer scale to the micrometer scale, as illustrated in FIGS. 1A to 3B. However, the size of the light emitting element LD may be changed in various ways depending on design conditions, etc. of each light emitting device, e.g., the pixel PXL.

In an embodiment, the first ends EP1 of the light emitting elements (e.g., valid light emitting elements completely connected between the first and second electrodes ET1 and ET2) LD may be electrically connected to the first electrode ET1 via the first contact electrode CE1. The second ends EP2 of the light emitting elements LD may be connected to the second electrode ET2 via the second contact electrode CE2. In an embodiment, at least one of the first and second ends EP1 and EP2 of the light emitting elements LD may come into direct contact with the first and/or second electrodes ET1 and/or ET2 and be electrically connected to the first and/or second electrodes ET1 and/or ET2.

In an embodiment, the light emitting elements LD may be prepared in a diffused form in a solution, and supplied to the emission area EMA by an inkjet scheme or the like. For example, the light emitting elements LD may be mixed with a volatile solvent and supplied to each emission area EMA. Here, if alignment voltages (or alignment signals) are applied to the first and second electrodes ET1 and ET2, an electric field may be formed between the first and second electrodes ET1 and ET2, whereby the light emitting elements LD may be aligned between the first and second electrodes ET1 and ET2. After the light emitting elements LD have been aligned, the solvent may be removed by a volatilization scheme or other schemes. In this way, the light emitting elements LD may be reliably arranged between the first and second electrodes ET1 and ET2.

In a case where light emitting elements LD are aligned in an electrode unit in which a plurality of first and second electrodes ET1 and ET2 may be arranged, the light emitting elements LD may tend to be focused on the perimeter of the electrode unit due to interference or the like of electric fields between the electrodes. To address the foregoing problem, an insulating bank pattern may be disposed on the perimeter of the electrode unit, or a coating layer may be formed to prevent a solution (or paste) including the light emitting elements LD from spreading. However, in a case where the insulating bank pattern is disposed, the light emitting elements LD may be focused around the insulating bank pattern. In a case where the coating layer is disposed, the complexity of the fabricating process may increase.

The light emitting device (or the pixel PXL) in accordance with embodiments of the disclosure may control the alignment density and alignment positions of the light emitting elements LD by using the third electrode ET3 that may float. For example, the light emitting elements LD may be disposed to be focused on a central area of the pixel PXL.

For example, an electric field close to or substantially zero may be formed on the third electrode ET3 that floats. Voltage and electric field distribution may rapidly vary on the first and second electrodes (ET1, ET1', ET2, and ET2' of FIG. 6) adjacent to the third electrode ET3. Such relatively rapid voltage and electric field variation may more markedly affect the alignment of the light emitting elements LD. Therefore, compared to other techniques, the number of light emitting elements LD aligned around the first and second electrodes (ET1, ET1', ET2, and ET2' of FIG. 6) adjacent to the third electrode ET3 may increase.

The first contact electrode CE1 and the second contact electrode CE2 may be respectively formed on the opposite ends of the light emitting elements LD, e.g., the first and second ends EP1 and EP2. Consequently, the light emitting elements LD may be more reliably connected between the first and second electrodes ET1 and ET2.

If the first ends EP1 of the light emitting elements LD are electrically connected to the first power supply VDD via the first electrode ET1, the pixel circuit PXC, and/or the first power line PL1, etc., and the second ends EP2 of the light emitting elements LD are electrically connected to the second power supply VSS via the second electrode ET2 and/or the second power line PL2, etc., at least one light emitting element LD connected in the forward direction between the first and second electrodes ET1 and ET2 may emit light at a luminance corresponding to driving current supplied from the pixel circuit PXC or the like. Thereby, the pixel PXL may emit light.

As described above, after the light emitting elements LD may be supplied to each emission area EMA (or simultaneously with the supply of the light emitting elements LD), at the step of aligning the light emitting elements LD by applying an alignment voltage (or an alignment signal) between the first and second electrodes ET1 and ET2, disposition of the third electrode ET3 that may form an electric field may increase the alignment density of light emitting elements LD arranged around the first and second electrodes (ET1, ET1', ET2, and ET2' of FIG. 6) adjacent to the third electrode ET3. Therefore, depending on the disposition location of the third electrode ET3, the density of the light emitting elements LD according to a location in the pixel PXL may be comparatively easily controlled. As a result, the luminance of the pixel PXL may increase, and the size and shape of the emission area EMA may be easily controlled.

FIGS. 8A, 8B, 8C, and 8D are sectional views schematically illustrating examples of a cross-section corresponding to line I-I' of the light emitting device of FIG. 6.

Referring to FIGS. 4 to 8D, the pixel PXL including the light emitting device, or the display device may include a display element layer DPL including a plurality of light emitting elements LD disposed in the emission area EMA of each pixel PXL on one surface of the base layer BSL. Furthermore, the pixel PXL or the display device including the pixel PXL may selectively further include a pixel circuit layer PCL. For example, the pixel PXL or the display device including the pixel PXL may further include a pixel circuit layer PCL disposed between the base layer BSL and the display element layer DPL.

In an embodiment, the pixel circuit layer PCL may include at least one circuit element electrically connected to the light emitting elements LD. For example, the pixel circuit layer PCL may include at least one circuit element which forms the pixel circuit PXC of each pixel PXL.

For example, the pixel circuit layer PCL may include a plurality of transistors T and a storage capacitor Cst that are disposed in each pixel and form the corresponding pixel circuit PXC, and may further include at least one power line and/or a signal line that may be connected to the pixel circuit PXC and/or the light source unit LSU. Here, in the case where the pixel circuit PXC may be omitted and each light source unit LSU may be directly connected to the first and second power lines PL1 and PL2 (or signal lines), the pixel circuit layer PCL may be omitted. For the sake of explanation, FIGS. 8A to 8D representatively illustrate only any one transistor T among the circuit elements and the lines that are disposed on the pixel circuit layer PCL. Here, the plane/section structure of the pixel circuit layer PCL may be changed in various ways. The positions and cross-sectional structures of each transistor T may be changed in various ways depending on embodiments. Furthermore, a configuration of a transistor T' of FIGS. 8A to 8D may be substantially the same as that of the transistor T, so that explanation of the transistor T' that overlaps with that of the transistor T will be skipped.

Furthermore, the pixel circuit layer PCL may include a plurality of insulating layers disposed between respective electrodes and/or lines. In an embodiment, the pixel circuit layer PCL may include a buffer layer BFL, a gate insulating layer GI, an interlayer insulating layer ILD, and a passivation layer PSV which may be successively stacked on a surface of the base layer BSL. In some embodiments, the pixel circuit layer PCL may further include at least one light shielding pattern (not shown) disposed under at least some transistors T.

The buffer layer BFL may prevent impurities from diffusing into each circuit element. The buffer layer BFL may be formed of a single layer, or may be formed of multiple layers having at least two layers. In the case where the buffer layer BFL has a multilayer structure, the respective layers may be formed of the same material or different materials. In an embodiment, the buffer layer BFL may be omitted.

In an embodiment, each transistor T may include a semiconductor layer SCL, a gate electrode GE, and first and second transistor electrodes TE1 and TE2. Although FIGS. 8A to 8D illustrate an embodiment in which each transistor T includes the first and second transistor electrodes TE1 and TE2 that are formed separately from the semiconductor layer SCL, the disclosure is not limited thereto. For example, in an embodiment, the first and/or second transistor electrode TE1 and/or TE2 provided in at least one transistor T disposed in each pixel may be integrally formed with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL may be formed. The semiconductor layer SCL may include a first area which comes into contact with each first transistor electrode TE1, a second area which comes into contact with each second transistor electrode TE2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc., or a combination thereof. The channel area of the semiconductor layer SCL may be an intrinsic semiconductor, which may be an undoped semiconductor pattern. Each of the first and second areas of the semiconductor layer SCL may be a semiconductor pattern doped with an impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes TE1 and TE2 may be disposed on each semiconductor layer SCL with at least one interlayer insulating layer ILD interposed therebetween. For example, the first and second transistor electrodes TE1 and TE2 may be disposed on respective different ends of the semiconductor layer SCL with the gate insulating layer GI and the interlayer insulating layer ILD interposed therebetween. The first and second transistor electrodes TE1 and TE2 may be electrically connected to each semiconductor layer SCL. For example, the first and second transistor electrodes TE1 and TE2 may be connected to the first and second areas of the semiconductor layer SCL through corresponding contact holes which pass through the gate insulating layer GI and the interlayer insulating layer ILD. In an embodiment, any one of the first and second transistor electrodes TE1 and TE2 may be a source electrode, and the other may be a drain electrode.

At least one transistor T provided in the pixel circuit PXC may be connected to at least one pixel electrode. For example, any one (e.g., the drain electrode) of the first and second transistor electrodes TE1 and TE2 of the first transistor T1 illustrated in FIG. 5C may be electrically connected to the first electrodes ET1 and ET1' of the light emitting device both through a contact hole (e.g., the first contact hole CH1) passing through the passivation layer PSV and through the first connection electrode CNL1 provided over the passivation layer PSV.

In an embodiment, at least one signal line and/or power line that may be connected to each pixel PXL may be disposed on a layer identical with that of one electrode of each of the circuit elements that form the pixel circuit PXC. For example, the scan line Si of each pixel PXL may be disposed on the same layer as that of the gate electrodes GE. The data line Dj of each pixel PXL may be disposed on the same layer as that of the first and second transistor electrodes TE1 and TE2 of the transistors T. Furthermore, the first and/or second power lines PL1 and PL2 may be disposed on the same layer as that of the gate electrodes GE or the first and second transistor electrodes TE1 and TE2 of the transistors T.

In an embodiment, the display element layer DPL may include a light source unit LSU of each of the pixels PXL. For example, the display element layer DPL may include a plurality of first and second electrodes ET1, ET1', ET2, and ET2' disposed in the emission area EMA of each pixel PXL, a plurality of light emitting elements LD and LD' arranged between the adjacent first and second electrodes ET1, ET1', ET2, and ET2', and a third electrode ET3 disposed at a preset position between the first and second electrodes ET1, ET1', ET2, and ET2'. Furthermore, the display element layer DPL may selectively further include first to third bank patterns PW1, PW1', PW2, PW2', and PW3 that causes areas of the first to third electrodes ET1, ET1', ET2, ET2', and ET3 to protrude upward, and first and second contact electrodes CE1, CE1', CE2, and CE2' that more reliably connect the light emitting elements LD and LD' between the first and second electrodes ET1, ET1', ET2, and ET2'. The display element layer DPL may further include, e.g., at least one conductive layer and/or insulating layer.

The first electrode ET1', the second electrode ET2', the light emitting element LD', the first contact electrode CE1', the second contact electrode CE2', the first bank pattern PW1', the second bank pattern PW2', the first contactor CNT1', and the second contactor CNT2' that are some components of the light emitting element that are disposed to the right of the third electrode ET3 may be respectively substantially the same as the first electrode ET1, the second electrode ET2, the light emitting element LD, the first contact electrode CE1, the second contact electrode CE2, the first bank pattern PW1, the second bank pattern PW2, the first contactor CNT1, and the second contactor CNT2 that are some components of the light emitting element that are disposed to the left of the third electrode ET3. Therefore, for the sake of explanation, descriptions of the first electrode ET1, the second electrode ET2, the light emitting element LD, the first contact electrode CE1, the second contact electrode CE2, the first bank pattern PW1, the second bank pattern PW2, the first contactor CNT1, and the second contactor CNT2 may also be applied in the same manner to the first electrode ET1', the second electrode ET2', the light emitting element LD', the first contact electrode CE1', the second contact electrode CE2', the first bank pattern PW1', the second bank pattern PW2', the first contactor CNT1', and the second contactor CNT2'.

In an embodiment, as illustrated in FIGS. 8A to 8D, the components of the light emitting device that may be disposed on the opposite sides of the third electrode ET3 may form a symmetrical shape.

In an embodiment, the display element layer DPL may include first to third bank patterns PW1, PW2, and PW3, first to third electrodes ET1, ET2, and ET3, a first insulating layer INS1, light emitting elements LD, an insulating pattern INP, first and second contact electrodes CE1 and CE2, and a second insulating layer INS2, which may be successively disposed and/or formed over the base layer BSL and/or the pixel circuit layer PCL.

The first and second bank patterns PW1 and PW2 may be disposed at positions spaced apart from each other in the emission area of each pixel PXL. The first and second bank patterns PW1 and PW2 may protrude from the base layer BSL and/or the pixel circuit layer PCL in a height direction of the base layer BSL. In an embodiment, the first and second bank patterns PW1 and PW2 may have substantially a same height, but the disclosure is not limited thereto.

In an embodiment, the third bank pattern PW3 corresponding to the third electrode ET3 may be further disposed on the passivation layer PSV.

In an embodiment, the first bank pattern PW1 may be disposed between the base layer BSL and/or the pixel circuit layer PCL and each first electrode ET1. The first bank patterns PW1 may be disposed adjacent to the first ends EP1 of the light emitting elements LD. For example, one side surface of each of the first bank patterns PW1 may be positioned adjacent to the first ends EP1 of the light emitting elements LD and disposed to face the first ends EP1.

In an embodiment, the second bank pattern PW2 may be disposed between the base layer BSL and/or the pixel circuit layer PCL and the second electrode ET2. The second bank pattern PW2 may be disposed adjacent to the second ends EP2 of the light emitting elements LD. For example, one side surface of the second bank pattern PW2 may be positioned adjacent to the second ends EP2 of the light emitting elements LD and disposed to face the second ends EP2.

In an embodiment, the third bank pattern PW3 may be disposed between the base layer BSL and/or the pixel circuit layer PCL and the third electrode ET3. The third bank pattern PW3 may be covered with the third electrode ET3.

Figure 8A:
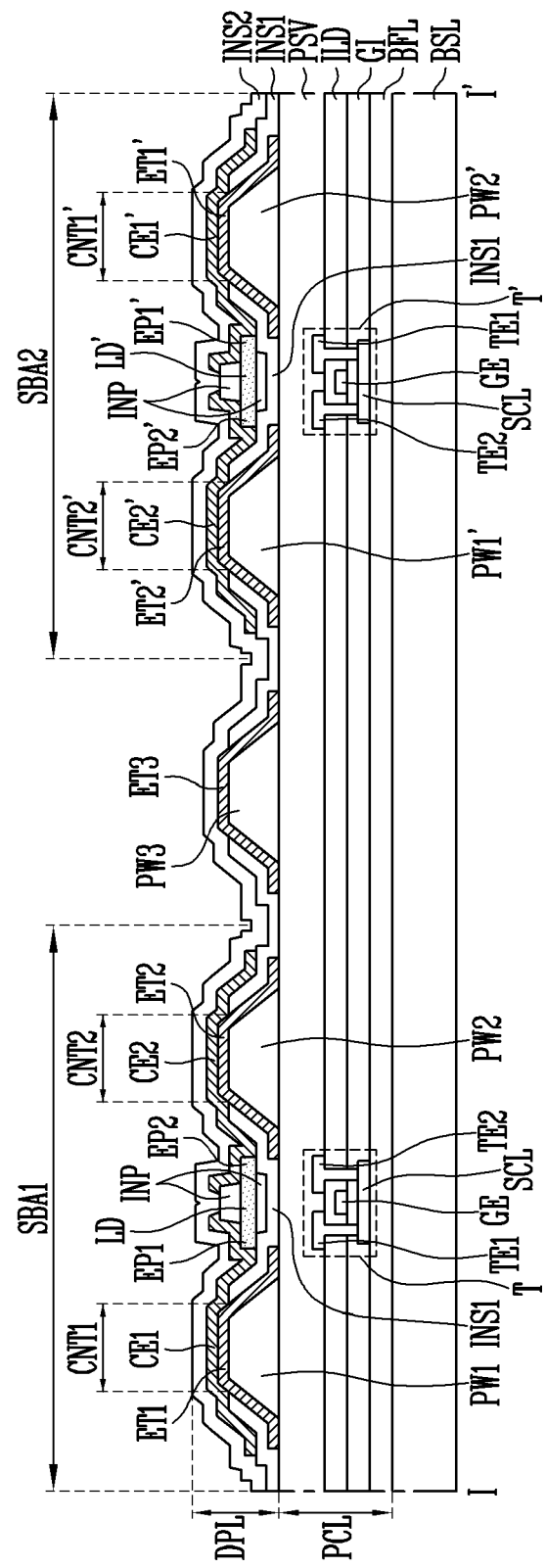
FIGS. 8A, 8B, 8C, and 8D are sectional views schematically illustrating examples of a cross-section corresponding to line I-I' of the light emitting device of FIG. 6.
Figure 8B:
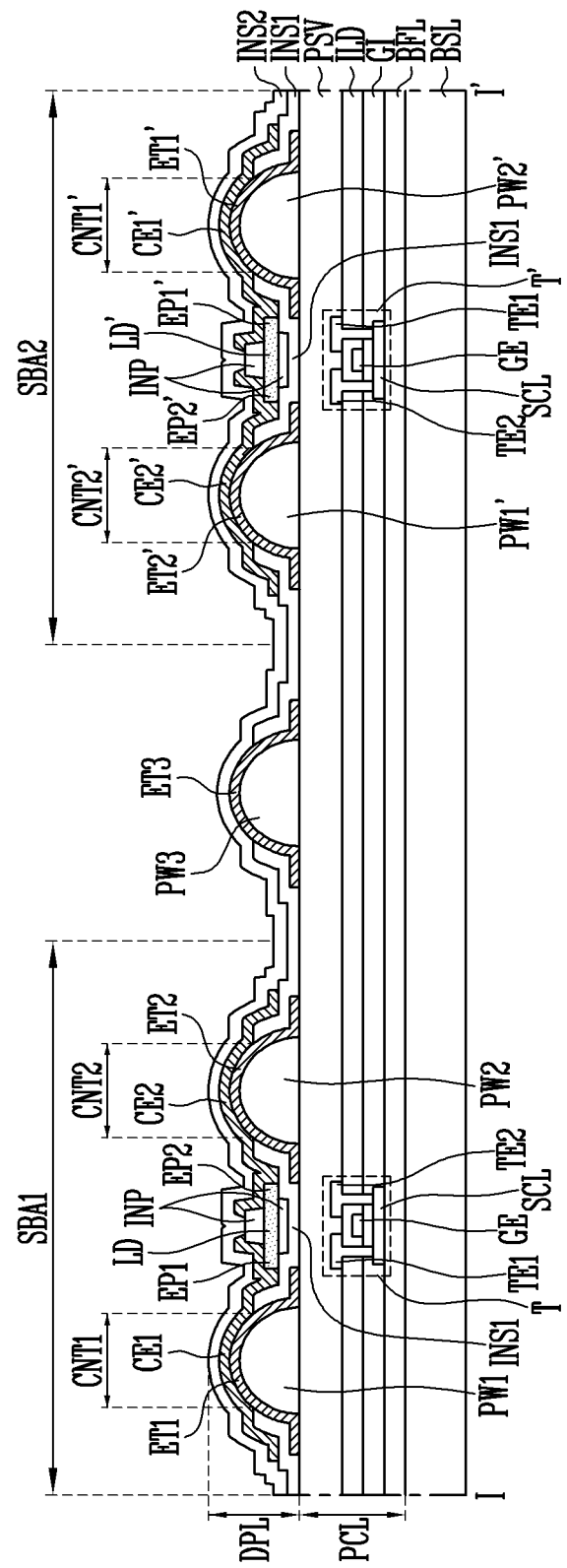
Figure 8C:
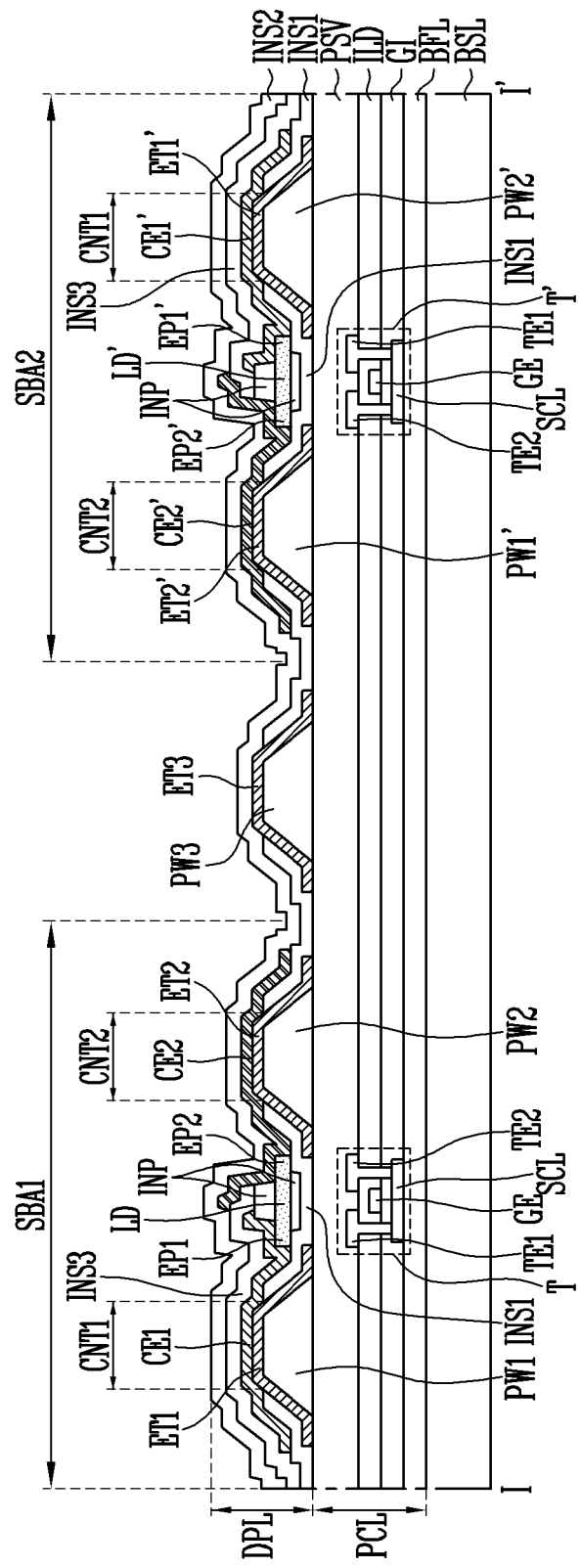
Figure 8D:
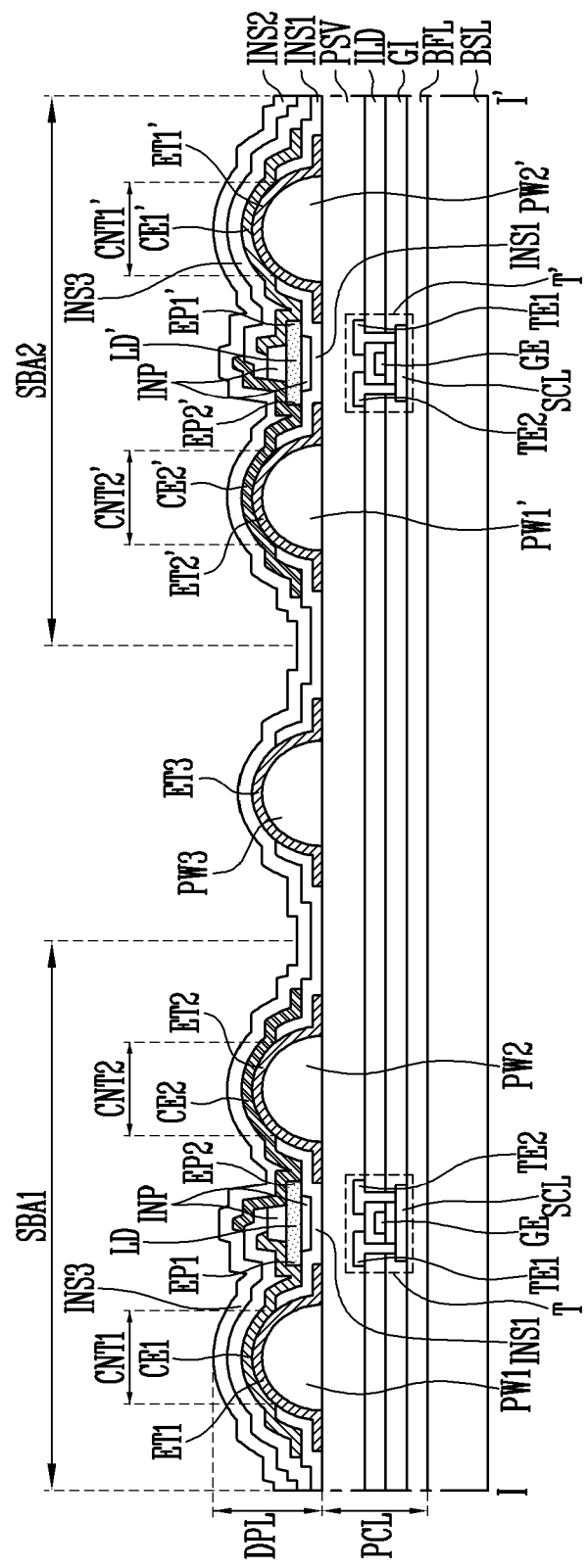

In an embodiment, each of the first to third bank patterns PW1, PW2, and PW3 may have various shapes. In an embodiment, as illustrated in FIGS. 8A and 8C, the first to third bank patterns PW1, PW2, and PW3 may have a trapezoidal cross-section the width of which may be gradually reduced upward. Each of the first to third bank patterns PW1, PW2, and PW3 may have an inclined surface on at least one side. In an embodiment, as illustrated in FIGS. 8B and 8D, the first to third bank patterns PW1, PW2, and PW3 may have a semi-circular or semi-elliptical cross-section the width of which may be gradually reduced upward. Each of the first to third bank patterns PW1, PW2, and PW3 may have a curved surface on at least one side surface. At least one electrode and/or insulating layer disposed over the first to third bank patterns PW1, PW2, and PW3 may have a curved surface in an area corresponding to the first to third bank patterns PW1, PW2, and PW3.

In other words, the shape of each of the first to third bank patterns PW1, PW2, and PW3 may be changed in various ways rather than being particularly limited. In an embodiment, at least one of the first to third bank patterns PW1, PW2, and PW3 may be omitted or changed in position.

Each of the first to third bank patterns PW1, PW2, and PW3 may include insulating material having at least one inorganic material and/or organic material. For example, the first to third bank patterns PW1, PW2, and PW3 may include at least one inorganic layer including various inorganic insulating materials such as silicon nitride (SiNx) or silicon oxide (SiOx). In other embodiments, the first to third bank patterns PW1, PW2, and PW3 may include at least one organic layer and/or photoresist layer containing various kinds of organic insulating materials, or may form a single or multi-layer insulator containing organic/inorganic materials in combination. In an embodiment of the disclosure, the constituent materials of the first to third bank patterns PW1, PW2, and PW3 may be changed in various ways.

In an embodiment, each of the first and second bank patterns PW1 and PW2 may function as a reflector. For example, the first and second bank patterns PW1 and PW2, along with the first and second electrodes ET1 and ET2 provided on the first and second bank patterns PW1 and PW2, may function as reflectors that guide light emitted from each light emitting element LD in a desired direction, thus enhancing the light efficiency of the pixel PXL.

The first to third electrodes ET1, ET2, and ET3 may be respectively disposed over the first to third bank patterns PW1, PW2, and PW3. The first to third bank patterns PW1, PW2, and PW3 may be disposed at positions spaced apart from each other in each pixel (particularly, each emission area EMA).

In an embodiment, the first to third electrodes ET1, ET2, and ET3, etc. that may be respectively disposed over the first to third bank patterns PW1, PW2, and PW3 may have shapes corresponding to the respective shapes of the first to third bank patterns PW1, PW2, and PW3. For example, the first to third electrodes ET1, ET2, and ET3 may have inclined surfaces or curved surfaces corresponding to the first to third bank patterns PW1, PW2, and PW3, respectively, and protrude in the height direction of the base layer BSL.

Each of the first to third electrodes ET1, ET2, and ET3 may include at least one conductive material. For example, each of the first to third electrodes ET1, ET2, and ET3 may include at least one material among various metal materials including silver (Ag), magnesium (Mg), aluminium (Al), platinum (Pt), palladium (Pd), gold (Au), nickel (Ni), neodymium (Nd), iridium (Ir), chromiume (Cr), titanium (Ti), molybdenum (Mo), copper (Cu), etc., or an alloy thereof, conductive oxide such as indium tin oxide (ITO), indium zinc oxide (IZO), zinc oxide (ZnO), antimony zinc oxide (AZO), indium tin zinc oxide (ITZO), zinc oxide (ZnO), tin oxide (SnO$_2$), and a conductive polymer such as PEDOT, but the disclosure is not limited thereto. For example, each of the first to third electrodes ET1, ET2, and ET3 may include other conductive materials such as a carbon nano tube and a graphene. In other words, each of the first to third electrodes ET1, ET2, and ET3 may include at least one of various conductive materials to have conductivity, and the constituent material thereof is not particularly limited. Furthermore, each of the first to third electrodes ET1, ET2, and ET3 may have the same conductive material, or at least one different conductive material.

In an embodiment, the third electrode ET3 that may not be electrically connected with the first and second electrodes ET1 and ET2 may be formed through the same process as that of the first and second electrodes ET1 and ET2. Therefore, the third electrode ET3 may include the same material as that of the first and second electrodes ET1 and ET2. The third electrode ET3 may have a shape substantially identical or similar to that of the first and second electrodes ET1 and ET2. Furthermore, the first to third electrodes ET1, ET2, and ET3 may be formed on the same insulating layer. For example, the first to third electrodes ET1, ET2, and ET3 may be disposed on the passivation layer PSV and/or respectively on the first to third bank patterns PW1, PW2, and PW3 that are formed through the same process.

Hence, the third electrode ET3 may be additionally formed by a simple scheme without using additional material or an additional process of forming the third electrode ET3. Hence, the cost for designing and fabricating the third electrode ET3 may not be required.

In an embodiment, each of the first to third electrodes ET1, ET2, and ET3 may have a single-layer or multi-layer structure. For example, each of the first to third electrodes ET1, ET2, and ET3 may include at least one reflective electrode layer. Each of the first to third electrodes ET1, ET2, and ET3 may selectively further include at least one of at least one transparent electrode layer disposed over and/or under the reflective electrode layer, and at least one conductive capping layer covering an upper portion of the reflective electrode layer and/or the transparent electrode layer.

In an embodiment, the reflective electrode layer of each of the first to third electrodes ET1, ET2, and ET3 may be formed of conductive material having a uniform reflectivity. For example, the reflective electrode layer may include at least one of various metal materials including silver (Ag), magnesium (Mg), aluminium (Al), platinum (Pt), palladium (Pd), gold (Au), nickel (Ni), neodymium (Nd), iridium (Ir), chromiume (Cr), titanium (Ti), molybdenum (Mo), copper (Cu), etc., or an alloy thereof, but the disclosure is not limited thereto. In other words, reflective electrode layer may be formed of various reflective conductive materials.

Each of the first and second electrodes ET1 and ET2 that includes the reflective electrode layer may enable light emitted from the opposite ends of each of the light emitting elements LD, e.g., the first and second ends EP1 and EP2, to travel in a direction (e.g., in a frontal direction) in which an image may be displayed. Particularly, if the first and second electrodes ET1 and ET2 respectively have inclined or curved surfaces corresponding to the shapes of the first and second bank patterns PW1 and PW2 and may be respectively disposed to face the first and second ends EP1 and EP2 of the light emitting elements LD, light emitted from the first and second ends EP1 and EP2 of each of the light emitting elements LD may be reflected by the first and second electrodes ET1 and ET2 and thus more reliably travel in the frontal direction of the display panel PNL (e.g., in an upward direction of the base layer BSL). Thereby, the efficiency of light emitted from the light emitting elements LD may be enhanced.

Furthermore, the transparent electrode layer of each of the first to third electrodes ET1, ET2, and ET3 may be formed of various transparent conductive materials. For example, the transparent electrode layer may include ITO, IZO, ITZO, or a combination thereof, but the disclosure is not limited thereto. In an embodiment, each of the first to third electrodes ET1, ET2, and ET3 may have a triple-layer structure having a stacked structure of ITO/Ag/ITO. As such, if the first and second electrodes ET1 and ET2 each are formed of a multilayer structure including at least two layers, voltage drop due to signal delay (RC delay) may be minimized. Thus, a desired voltage can be effectively transmitted to the light emitting elements LD.

If each of the first to third electrodes ET1, ET2, and ET3 includes the conductive capping layer covering the reflective electrode layer and/or the transparent electrode layer, it may be possible to prevent the reflective electrode layer of the first to third electrodes ET1, ET2, and ET3 from being damaged due to defects caused during the manufacturing process of the pixel PXL. However, the conductive capping layer may be selectively included in the first to third electrodes ET1, ET2, and ET3 and may be omitted depending on embodiments. Furthermore, the conductive capping layer may be considered as a component of each of the first to third electrodes ET1, ET2, and ET3, or considered as a separate component disposed on the first to third electrodes ET1, ET2, and ET3.

The first insulating layer INS1 may be disposed on areas of the first to third electrodes ET1, ET2, and ET3. For example, the first insulating layer INS1 may be formed to cover areas of the first to third electrodes ET1, ET2, and ET3, and may include an opening to expose other areas of the first to third electrodes ET1, ET2, and ET3. For example, the first insulating layer INS1 may expose the first and second electrodes ET1 and ET2 in first and second contactors CNT1 and CNT2. In some embodiments, the first insulating layer INS1 may be omitted. The light emitting elements LD may be directly disposed on the passivation layer PSV and/or one end of each of the first and second electrodes ET1 and ET2.

In an embodiment, the first insulating layer INS1 may be primarily formed to cover the overall surfaces of the first to third electrodes ET1, ET2, and ET3. After the light emitting elements LD may be supplied and aligned on the first insulating layer INS1, the first insulating layer INS1 may be partially opened to expose the first and second electrodes ET1 and ET2 in respective areas (e.g., the respective first and second contactors CNT1 and CNT2) on the first and second bank patterns PW1 and PW2. In an embodiment, the first insulating layer INS1 may be patterned in the form of an individual pattern which may be sectionally disposed under the light emitting elements LD after the supply and alignment of the light emitting elements LD have been completed.

In other words, the first insulating layer INS1 may be interposed between the first and second electrodes ET1 and ET2 and the light emitting elements LD, and may expose at least one area of each of the first and second electrodes ET1 and ET2. After the first to third electrodes ET1, ET2, and ET3 may be formed, the first insulating layer INS1 may be formed to cover the first to third electrodes ET1, ET2, and ET3, so that it may be possible to prevent the first to third electrodes ET1, ET2, and ET3 from being damaged or to prevent metal from being precipitated in a subsequent process. Furthermore, the first insulating layer INS1 may stably support each light emitting element LD.

The first insulating layer INS1 may be formed of a single layer or multiple layers, and include at least one inorganic insulating material and/or organic insulating material. For example, the first insulating layer INS1 may include various kinds of organic/inorganic insulating materials including silicon nitride (SiNx), silicon oxide (SiOx), aluminum oxide ($Al_2O_3$), etc., or a combination thereof. The constituent material of the first insulating material INS1 is not particularly limited.

A plurality of light emitting elements LD may be supplied to and aligned in each pixel, particularly, the emission area EMA of each pixel PXL, in which the first insulating layer INS1 may be formed. For example, a plurality of light emitting elements LD may be supplied to each emission area EMA through an inkjet method or the like, and the light emitting elements LD may be aligned with the directionality between the first and second electrodes ET1 and ET2 by alignment voltages (or alignment signals) applied to the first and second electrodes ET1 and ET2.

Here, thanks to the third electrode ET3 that may float, the arrangement of the light emitting elements LD may be focused between the first and second electrodes ET1 and ET2 adjacent to the third electrode ET3.

In an embodiment, at least some of the light emitting elements LD may be disposed in the horizontal direction between a pair of first and second electrodes ET1 and ET2 such that the opposite ends (i.e., the first and second ends EP1 and EP2) of each light emitting element LD with respect to the longitudinal direction thereof may overlap the pair of first and second electrodes ET1 and ET2. Furthermore, in an embodiment, others of the light emitting elements LD may be disposed in a diagonal direction between the pair of first and second electrodes ET1 and ET2. In an embodiment, at least some of the light emitting elements LD may be disposed between a pair of first and second electrodes ET1 and ET2 such that the at least some light emitting elements LD do not overlap the first and second electrodes ET1 and ET2, and may be connected to the first and second electrodes ET1 and ET2 respectively through the first contact electrode CE1 and the second contact electrode CE2.

The insulating pattern INP may be disposed on areas of the light emitting elements LD. For example, the insulating pattern INP may expose the first and second ends EP1 and EP2 of the light emitting elements LD and be partially disposed over only the areas of the light emitting elements LD including respective central areas of the light emitting elements LD. The insulating pattern INP may be formed in an independent pattern on each emission area EMA, but the disclosure is not limited thereto. The insulating pattern INP may be omitted depending on embodiments. The opposite ends of the first and second contact electrodes CE1 and CE2 may be directly disposed on the light emitting elements LD.

The insulating pattern INP may be formed of a single layer or multiple layers, and include at least one inorganic insulating material and/or organic insulating material. For example, the insulating pattern INP may include various kinds of organic/inorganic insulating materials including silicon nitride (SiNx), silicon oxide (SiOx), aluminum oxide ($Al_2O_3$), photoresist (PR) material, etc., or a combination thereof. The constituent material of the insulating pattern INP is not particularly limited.

After the alignment of the light emitting elements LD has been completed, the insulating pattern INP may be formed on the light emitting elements LD so that the light emitting elements LD may be prevented from being removed from the aligned position. Furthermore, in the case where space may be present between the first insulating layer INS1 and the light emitting elements LD, the space may be filled with the insulating material drawn thereinto during a process of forming the insulating pattern INP. Consequently, the light emitting elements LD may be more stably supported.

The opposite ends of the light emitting elements LD, e.g., the first and second ends EP1 and EP2, which are not covered with the insulating pattern INP, may be respectively covered with the first and second contact electrodes CE1 and CE2. For example, respective ends of the first and second contact electrodes CE1 and CE2 may be disposed, at positions spaced apart from each other, on the first and second ends EP1 and EP2 of the light emitting elements LD, with the insulating pattern INP interposed therebetween.

In an embodiment, the first and second contact electrodes CE1 and CE2 may be simultaneously formed on a same layer on one surface of the base layer BSL, as illustrated in FIGS. 8A and 8B. Hence, a process of fabricating the pixel PXL and the display device including the pixel PXL may be simplified. For example, compared to the case where the first and second contact electrodes CE1 and CE2 are formed through respective mask processes, the number of mask processes needed to form the pixel PXL may be reduced, and the first and second contact electrodes CE1 and CE2 may be more easily formed.

In an embodiment, the first and second contact electrodes CE1 and CE2 may be successively formed on different layers on a surface of the base layer BSL, as illustrated in FIGS. 8C and 8D. An additional third insulating layer INS3 may be disposed between the first and second contact electrodes CE1 and CE2. In other words, the positions and the relative disposition relationship of the first and second contact electrodes CE1 and CE2 may be changed in various ways.

Furthermore, the first and second contact electrodes CE1 and CE2 may be disposed over the first and second electrodes ET1 and ET2 to cover exposed areas (e.g., the first and second contactors CNT1 and CNT2) of the first and second electrodes ET1 and ET2. For example, the first and second contact electrodes CE1 and CE2 may be disposed on at least areas of the first and second electrodes ET1 and ET2 to come into contact with the first and second electrodes ET1 and ET2 in the first and second contactors CNT1 and CNT2. Hence, the first and second contact electrodes CE1 and CE2 may be respectively electrically connected to the first and second electrodes ET1 and ET2. The first and second electrodes ET1 and ET2 may be respectively electrically connected to the first and second ends EP1 and EP2 of the light emitting elements LD through the first and second contact electrodes CE1 and CE2.

In an embodiment, the first and second contact electrodes CE1 and CE2 may be formed of various transparent conductive materials. For example, the first and second contact electrodes CE1 and CE2 may include at least one of various transparent conductive materials including ITO, IZO, ITZO, or a combination thereof, and may be substantially transparent or translucent to satisfy a transmittancy. Hence, light emitted from the light emitting elements LD through the first and second ends EP1 and EP2 may be emitted out of the display device through the first and second contact electrodes CE1 and CE2.

The second insulating layer INS2 may be disposed on the first and second contact electrodes CE1 and CE2. For example, the second insulating layer INS2 may be formed and/or disposed on the overall surface of the display area DA of display area DA of the base layer BSL on which the first and second bank patterns PW1 and PW2, the first and second electrodes ET1 and ET2, the light emitting elements LD, the insulating pattern INP, and the first and second contact electrodes CE1 and CE2 may be formed, so that the second insulating layer INS2 may cover the first and second bank patterns PW1 and PW2, the first and second electrodes ET1 and ET2, the light emitting elements LD, the insulating pattern INP, and the first and second contact electrodes CE1 and CE2.

In an embodiment, the second insulating layer INS2 may be disposed to cover the exposed third electrode ET3.

The second insulating layer INS2 may include at least one inorganic layer and/or organic layer.

In an embodiment, the second insulating layer INS2 may include a thin-film encapsulation layer having a multilayer structure, but the disclosure is not limited thereto. In some embodiments, at least one overcoat layer, and/or an encapsulation substrate, etc., may be further disposed over the second insulating layer INS2.

In an embodiment, the second insulating layer INS2 may be formed of a single layer or multiple layers, and include at least one inorganic insulating material and/or organic insulating material. For example, the second insulating layer INS2 may include various kinds of organic/inorganic insulating materials including silicon nitride (SiNx), silicon oxide (SiOx), etc., or a combination thereof. The constituent material of the second insulating layer INS2 is not particularly limited.

FIG. 9 is a plan diagram schematically illustrating a light emitting device in accordance with an embodiment of the disclosure.

FIG. 9 illustrates a modification of the pixel PXL or the light emitting device in accordance with the embodiment of FIGS. 6 to 8D. Like reference numerals are used to designate the same or similar components as those of the above-mentioned embodiment, and detailed description thereof will be omitted.

Referring to FIGS. 6 and 9, the light emitting device may include first and second electrodes ETS1 and ETS2 arranged in the first direction DR1, and a plurality of third electrodes ET31 and ET32 disposed at preset intervals.

In an embodiment, the first electrodes ETS1 may be connected to a circuit element, a power line, and/or a signal line through the first connection electrode (e.g., CNL1 of FIG. 6). All of the first electrodes ETS1 may be connected to the same first connection electrode. In another embodiment, at least some of the first electrodes ETS1 may be connected to different first connection electrodes.

The second electrodes ETS2 may be connected to a circuit element, a power line, and/or a signal line through the second connection electrode (e.g., CNL2 of FIG. 6). All of the second electrodes ETS2 may be connected to the same second connection electrode. In another embodiment, at least some of the second electrodes ETS2 may be connected to different second connection electrodes.

Adjacent first and second electrodes (e.g., ET1 and ET2 of FIG. 6) of the first and second electrodes ETS1 and ETS2 may form one electrode pair. The light emitting elements LD may be electrically connected to the electrode pair.

In an embodiment, the third electrodes ET31 and ET32 may be disposed at regular intervals. For example, as illustrated in FIG. 9, the third electrodes ET31 and ET32 may be disposed with six electrode pairs (i.e., six first electrodes and six second electrodes which are alternately disposed) interposed therebetween. However, this is only for illustrative purposes, and the intervals at which the third electrodes ET31 and ET32 are disposed is not limited thereto.

In an embodiment, electrodes having the same polarity may be disposed on the opposite sides of each of the third electrodes ET31 and ET32. Here, the electrodes having the same polarity may be electrodes which are supplied with the same alignment voltage at the step of aligning the light emitting elements LD. For example, the first electrodes ETS1 may be supplied in common with a first alignment voltage at the step of aligning the light emitting elements LD. The second electrodes ETS2 may be supplied in common with a second alignment voltage different from the first alignment voltage at the step of aligning the light emitting elements LD.

For example, some of the second electrodes ETS2 may be disposed on opposite sides of the 1st third electrode ET31 and oriented to face the 1st third electrode ET31. Some of the first electrodes ETS1 may be disposed on opposite sides of the 2nd third electrode ET32 and oriented to face the 2nd third electrode ET32. Since the same voltage may be applied to the electrodes disposed on the opposite sides of each of the third electrodes ET31 and ET32 in case that the first and second alignment voltages are applied at the step of aligning the light emitting elements LD, the light emitting elements LD adjacent to the third electrodes ET31 and ET32 may move away from the third electrodes ET31 and ET32.

Furthermore, the third electrodes ET31 and ET32 to which no voltage may be applied may not form an electric field. Hence, rather than being aligned or guided toward the third electrodes ET31 and ET32, the light emitting elements LD may move to other electrodes disposed around the third electrode ET31 and ET32. Thus, the arrangement of the light emitting elements LD may be focused on the electrode pair of electrodes adjacent to the third electrode ET3.

As illustrated in FIG. 9, the number of light emitting elements LD disposed on a first electrode pair that may be an electrode pair closest to each of the third electrodes ET31 and ET32 may be greater than the number of light emitting elements disposed on a second electrode pair that may be disposed at a position farther from each of the third electrodes ET31 and ET32 than the first electrode pair. Furthermore, the farther from the third electrodes ET31 and ET32, the less the density of the light emitting elements LD (or the number of light emitting elements LD) arranged on the electrode pair may be.

As such, since the third electrodes ET31 and ET32 that float are disposed between electrode pairs, the number of light emitting elements LD (or valid light emitting elements) around the third electrodes ET31 and ET32 may be increased. Therefore, the emission uniformity and the luminance per unit surface area around the third electrodes ET31 and ET32 may be improved.

In an embodiment, boundaries between the pixels may be defined based on the disposition of the electrodes as shown in FIG. 9, so that the emission luminance of the pixel may be controlled.

In an embodiment, the third electrodes ET31 and ET32 may be formed simultaneously with the first and second electrodes ETS1 and ETS2 through a patterning process of forming the first and second electrodes ETS1 and ETS2. For example, the third electrodes ET31 and ET32 may be formed by patterning additional areas such that some of the first and second electrodes ETS1 and ETS2 may be disconnected from other elements. In this way, the third electrodes ET31 and ET32 that float and secure a spaced distance between the electrodes having the same polarity may be formed without increase in the manufacturing cost.

Figure 10:
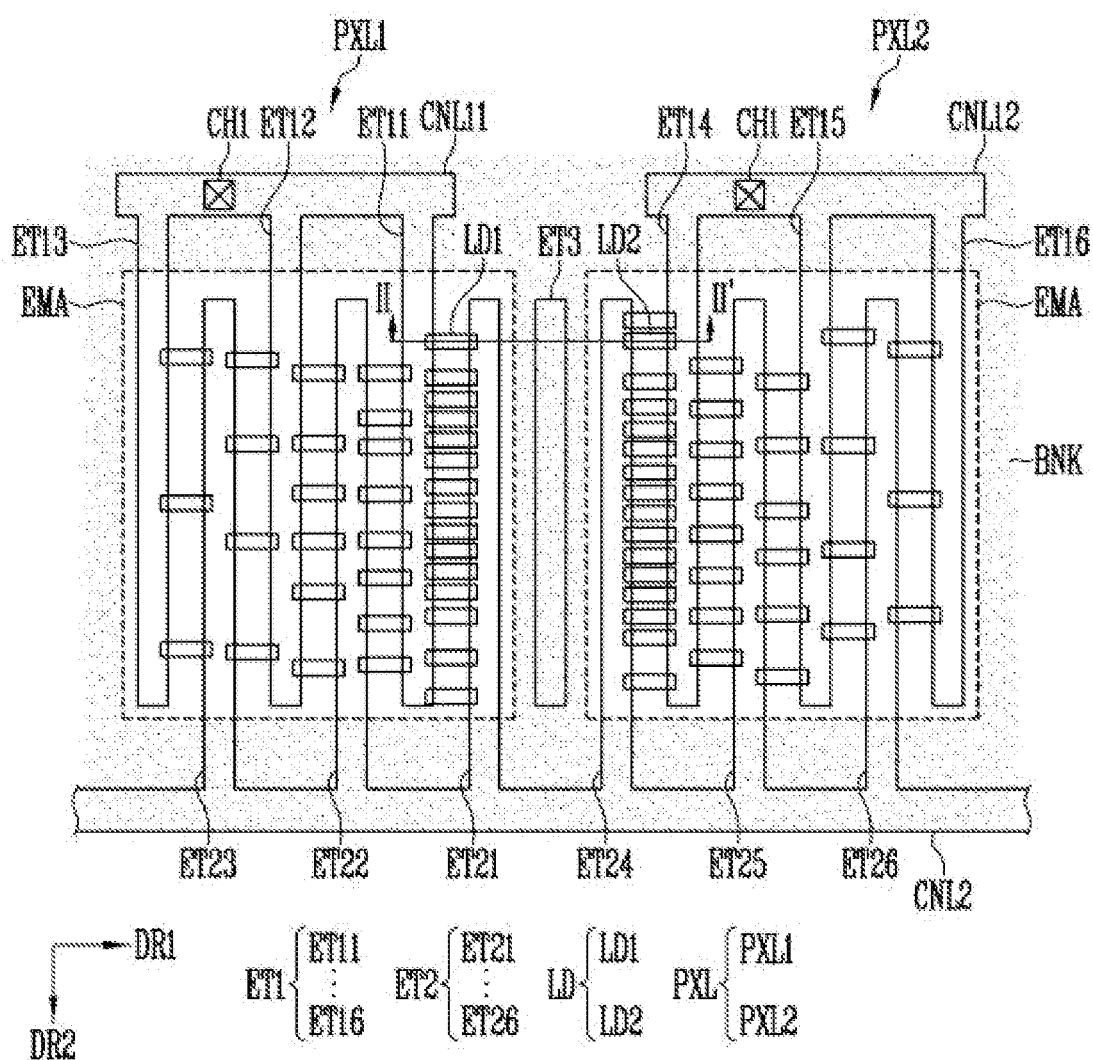
FIG. 10 is a plan view schematically illustrating a display device in accordance with an embodiment of the disclosure, and for example illustrates an embodiment of a pixel which forms the display device.

FIG. 10 is a plan view schematically illustrating a display device in accordance with an embodiment of the disclosure, and for example illustrates an embodiment of a pixel which forms the display device.

FIG. 10 illustrates structures of the pixels PXL1 and PXL2, focused on a display element layer on which the light emitting elements LD1 and LD2 of the pixels PXL1 and PXL2 may be disposed.

Referring to FIGS. 4 to 6 and 10, the pixels PXL1 and PXL2 may be disposed in the display area DA defined on the substrate (or the base layer BSL of FIG. 4).

Each of the first and second pixels PXL1 and PXL2 may include at least one pair of first and second electrodes ET1 and ET2, and an emission area EMA on which at least one light emitting element LD connected between the first and second electrodes ET1 and ET2 may be disposed. For example, as illustrated in FIG. 10, each of the first and second pixels PXL1 and PXL2 may include three first electrodes ET1 and three second electrodes ET2.

In an embodiment, the first pixel PXL1 may include a plurality of first electrodes ET11, ET12, and ET13 and a plurality of second electrodes ET21, ET22, and ET23 which may be disposed at positions spaced apart from each other in the corresponding emission area EMA, and a plurality of first light emitting elements LD1 connected between the first electrodes ET11, ET12, and ET13 and the second electrodes ET21, ET22, and ET23 that may be adjacent to each other.

In an embodiment, the second pixel PXL2 may include a plurality of first electrodes ET14, ET15, and ET16 and a plurality of second electrodes ET24, ET25, and ET26 which may be disposed at positions spaced apart from each other in the corresponding emission area EMA, and a plurality of second light emitting elements LD2 connected between the first electrodes ET14, ET15, and ET16 and the second electrodes ET24, ET25, and ET26 that may be adjacent to each other.

In an embodiment, the first pixel PXL1 may further include a first connection electrode CNL11 and a second connection electrode CNL2 which may be disposed in a non-emission area (e.g., overlapping with the bank BNK of FIG. 10).

In an embodiment, the first electrodes ET11, ET12, and ET13 of the first pixel PXL1 may be connected to the first connection electrode CNL11. For instance, the first electrodes ET11, ET12, and ET13 may be integrally connected to the first connection electrode CNL11. For example, the first electrodes ET11, ET12, and ET13 may be formed of at least one branch diverging from the first connection electrode CNL11. However, the disclosure is not limited thereto. For example, in an embodiment of the disclosure, the first electrodes ET11, ET12, and ET13 and the first connection electrode CNL11 may be individually formed and electrically connected to each other through at least one contact hole, via hole, or the like, which is not illustrated.

In an embodiment, the first electrodes ET11, ET12, and ET13 and the first connection electrode CNL11 may extend in different directions. For example, in case that the first connection electrode CNL11 extends in the first direction DR1, the first electrodes ET11, ET12, and ET13 may extend in the second direction DR2 intersecting with the first direction DR1.

In an embodiment, the second electrodes ET21, ET22, and ET23 may be connected to the second connection electrode CNL2. For instance, the second electrodes ET21, ET22, and ET23 may be integrally connected to the second connection electrode CNL2. For example, the second electrodes ET21, ET22, and ET23 may be formed of at least one branch diverging from the second connection electrode CNL2. However, the disclosure is not limited thereto. For example, in an embodiment of the disclosure, the second electrodes ET21, ET22, and ET23 and the second connection electrode CNL2 may be individually formed and electrically connected to each other through at least one contact hole, via hole, or the like, which is not illustrated.

In an embodiment, the second electrodes ET21, ET22, and ET23 and the second connection electrode CNL2 may extend in different directions. For example, in case that the second connection electrode CNL2 extends in the first direction DR1, the second electrode ET21, ET22, and ET23 may extend in the second direction DR2.

The second pixel PXL2 may further include a first connection electrode CNL12 and a second connection electrode CNL2 which are disposed in the non-emission area (e.g., overlapping with the bank BNK of FIG. 10).

In an embodiment, the first connection electrodes CNL11 and CNL12 of each of the first and second pixels PXL1 and PXL2 may be electrically (and physically) separated from each other between the first and second pixels PXL1 and PXL2. The second connection electrode CNL2 of the first and second pixels PXL1 and PXL2 may integrally extend. Therefore, the first light emitting elements LD1 included in the first pixel PXL1, and the second light emitting elements LD2 included in the second pixel PXL2 may separately emit light.

In an embodiment, the first and second pixels PXL1 and PXL2 may have a substantially identical or similar structure. In another embodiment, the first and second pixels PXL1 and PXL2 may have a substantially symmetrical structure based on the third electrode ET3. For the sake of explanation, hereinafter, an arbitrary one of the first and second pixels PXL1 and PXL2 will be comprehensively designated as "pixel PXL", and at least one first or second light emitting element LD1 or LD2 disposed in the pixel PXL will be comprehensively designated as "light emitting element LD".

In an embodiment, the first and second light emitting elements LD1 and LD2 may emit light of the same color or different colors. For example, all of the first and second light emitting elements LD1 and LD2 may be formed of blue light emitting diodes, which emit blue light. In another embodiment, the first and second light emitting elements LD1 and LD2 may emit one of red light, green light, and blue light. However, this is only for illustrative purposes, and the color of light emitted from the first and second light emitting elements LD1 and LD2 is not limited thereto.

The third electrode ET3 may not be electrically connected with the first and second electrodes ET1 and ET2. The third electrode ET3 may be disposed to be spaced apart from the first and second electrodes ET1 and ET2. In an embodiment, the third electrode ET3 may be disposed on a side of the first pixel PXL1 in the non-emission area. For example, the third electrode ET3 may be disposed in the non-emission area between the emission area EMA of the first pixel PXL1 and the emission area EMA of the second pixel PXL2.

The first and second electrodes ET11, ET12, ET13, ET21, ET22, and ET23 of the first pixel PXL1 and the first and second electrodes ET14, ET15, ET16, ET24, ET25, and ET26 of the second pixel PXL2 may form a symmetrical shape based on the third electrode ET3.

In an embodiment, the density at which the light emitting elements LD of the first and second pixels PXL1 and PXL2 may be disposed may increase in a direction from the center of each emission area EMA toward the third electrode ET3. For example, the first light emitting elements LD1 may be focused on the right side of the emission area EMA of the first pixel PXL1, and the second light emitting elements LD2 may be focused on the left side of the emission area EMA of the second pixel PXL2.

In an embodiment, the third electrodes ET3 may be disposed on the left side and the right side of the emission areas EMA of the first and second pixels PXL1 and PXL2. The light emitting elements LD may be focused on the opposite sides of the emission area EMA of the corresponding pixel PXL. For example, the density of light emitting elements LD may be lowest in the central portion of the emission area EMA, and the density of light emitting elements LD may increase in a direction from the center toward the opposite sides.

Figure 11A:
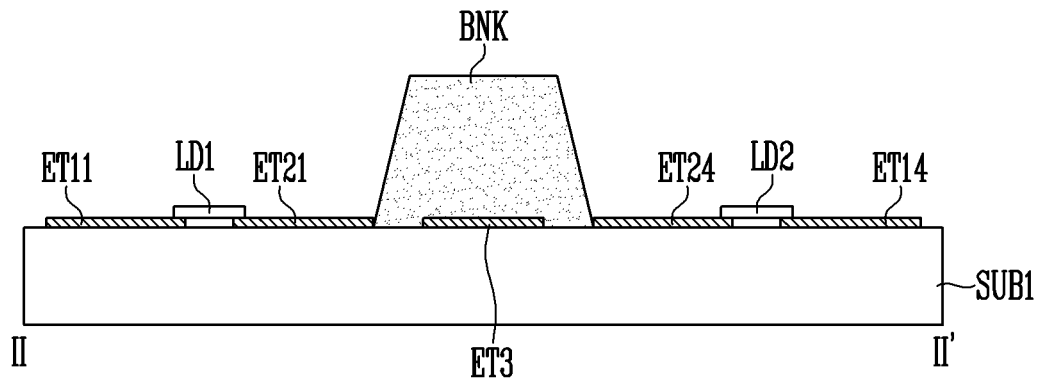
FIGS. 11A, 11B, and 11C are sectional views schematically illustrating examples of a cross-section corresponding to line II-II' of the display device of FIG. 10.
Figure 11B:
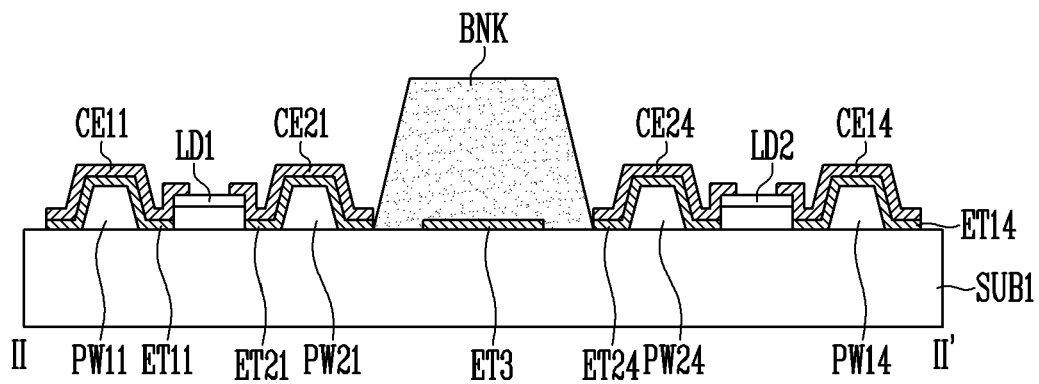
Figure 11C:
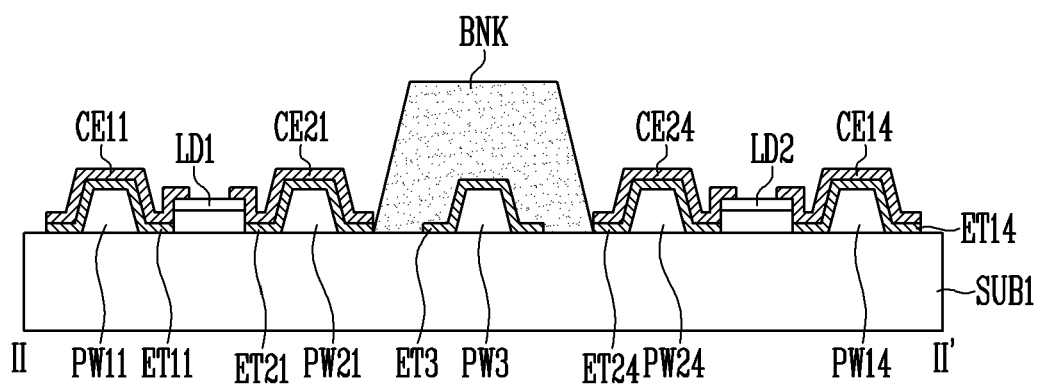

FIGS. 11A, 11B, and 11C are sectional views illustrating examples of a cross-section corresponding to line of the display device of FIG. 10.

For convenience sake, FIG. 10 schematically illustrates the structures of the display element layer DPL and the pixel circuit layer PCL described in detail with reference to FIGS. 6 to 8D, based on some components thereof, and detailed description thereof will be omitted. FIGS. 11A to 11C illustrate some emission areas and non-emission areas of the pixels PXL1 and PXL2 adjacent to each other.

Referring to FIGS. 4, 10, and 11A to 11C, the display device may include first electrodes ET11 to ET16, second electrodes ET21 to ET26, a third electrode ET3, light emitting elements LD1 and LD2, and a bank BNK that are disposed on a first substrate SUB1.

In an embodiment, the first substrate SUB1 may be embodied by the base layer BSL of FIG. 4, etc.

The third electrode ET3 may be disposed in the non-emission area which defines the boundary between the first pixel PXL1 and the second pixel PXL2. FIGS. 11A to 11C illustrate the electrode pairs of the first electrodes ET11 and ET14 and the second electrodes ET21 and ET24 that are disposed in the outermost portions of the first and second pixels PXL1 and PXL2.

In an embodiment, the light emitting elements LD may be directly connected between the first and second electrodes ET1 and ET2 adjacent to each other. For example, as illustrated in FIG. 11A, a bank pattern which overlaps with each of the first and second electrodes ET11, ET14, ET21, and ET24 may not be present thereunder. The third electrode ET3 may be formed through the same process as that of the first and second electrodes ET1 and ET2.

In an embodiment, as illustrated in FIG. 11B, the first and second bank patterns PW11, PW14, PW21, and PW24 may be respectively disposed under the first and second electrodes ET11, ET14, ET21, and ET24. In an area where the first and second bank patterns PW11, PW14, PW21, and PW24 are disposed, the first and second electrodes ET11, ET14, ET21, and ET24 may protrude upward. Hence, light emitted from the opposite ends (or sidewalls) of the light emitting elements LD may be controlled to more reliably travel in the frontal direction of the display device.

Furthermore, as illustrated in FIG. 11C, a third bank pattern PW3 having an individual pattern structure may be further disposed under the third electrode ET3. For example, as the electrodes ET1, ET2, and ET3, and the bank patterns PW1, PW2, and PW3 are formed at regular intervals, the third electrode ET3 that floats may be formed during an existing manufacturing process.

In an embodiment, a bank BNK that covers the third electrode ET3 may be disposed in the non-emission area. The bank BNK may be disposed to surround the pixel PXL. For example, the bank BNK may be formed between the pixels PXL to surround the emission area EMA, so that a pixel defining layer for defining the emission area EMA of each pixel PXL can be formed.

In an embodiment, the bank BNK may be formed to have a height greater than a height of the first and second bank patterns PW1 and PW2 (and the third bank pattern PW3). At a step of supplying the light emitting elements LD to each emission area EMA, the bank BNK may function as a dam structure that prevents a solution mixed with the light emitting elements LD from being drawn into the emission area EMA of an adjacent pixel PXL or control the amount of solution such that a constant amount of solution may be supplied to each emission area EMA.

Depending on embodiments, the bank BNK may have various shapes. In an embodiment, the bank BNK may have a trapezoidal cross-section which may be reduced in width upward. For example, the bank BNK may have, in an area bordering on the emission area EMA of each pixel PXL, an inclined surface which may be reduced in width upward. In an embodiment, the bank BNK may have, in an area bordering on the emission area EMA of each pixel PXL, a curved surface which may be reduced in width upward. In an embodiment, the bank BNK may have a shape which may be reduced in width upward, and the shape thereof may be changed in various ways.

Furthermore, the bank BNK may be formed to prevent light emitted from each emission area EMA from entering an adjacent emission area EMA and causing optical interference. To this end, the bank BNK may be formed to prevent light emitted from the light emitting elements LD of each pixel PXL from passing through the bank BNK.

For example, the bank BNK may be formed of a color bank including color filter material for blocking light of colors and/or wavelengths emitted from the first and second light emitting elements LD1 and LD2. In an embodiment, the color bank may include a color pigment (or a color dye) having a color different from the color of light emitted from the first and second light emitting elements LD1 and LD2. For example, the bank BNK may be formed of at least one color bank layer including color filter material for blocking light of colors and/or wavelengths emitted from the first and second light emitting elements LD1 and LD2. Therefore, the bank BNK may function as a light shielding layer that prevents light emitted from the first and second light emitting elements LD1 and LD2 from leaking into an adjacent emission area EMA.

In an embodiment, the light emitting elements LD may emit light having the same color. For example, all of the light emitting elements LD may be blue light emitting elements that emit blue light. The bank BNK may include color filter material that block light having a blue wavelength band and allow light having a wavelength band different from the blue wavelength band, e.g., light having a color and a wavelength band different from the blue wavelength band, to selectively pass through the bank BNK.

For example, the bank BNK may include red-based color filter material for allowing light having a wavelength band relatively far from the blue wavelength band in a visible ray area, e.g., red light, to selectively pass therethrough. However, the material of the bank BNK is not limited to the foregoing material.

For example, all of the light emitting elements LD may emit blue light, and the bank BNK may include yellow-based color filter material. In another embodiment, the bank BNK may include at least two colors of color filter materials. For example, the bank BNK may be formed of an orange color bank including a combination of red color pigment and yellow color pigment.

In this way, if the bank BNK is formed to include the color filter material for blocking predetermined color light of color emitted from the light emitting elements LD of each pixel PXL, the bank BNK may be formed without using black matrix material such as carbon black and also effectively prevent light from leaking between adjacent pixels PXL.

In an embodiment, a fourth insulating layer (not shown) may be disposed on the first substrate SUB1 on which the first and second electrodes ET1 and ET2, the light emitting elements LD, the first and second contact electrodes CE1 (referring to FIG. 6, for example, CE11 and CE14 in FIGS. 11b and 11c) and CE2 (referring to FIG. 6, for example, CE21 and CE24 in FIGS. 11b and 11c), the bank BNK, etc. may be disposed. For example, the fourth insulating layer may be formed on the overall surface of the display area DA to cover the upper surface of the first substrate SUB1 (or the base layer BSL of FIG. 4) on which the first and second electrodes ET1 and ET2, the light emitting elements LD, the first and second contact electrodes CE1 and CE2, the bank BNK, etc. may be disposed. In an embodiment, the fourth insulating layer may not only include at least one inorganic layer and/or organic layer for protecting components of the display element layer DPL, but may also include various functional layers, etc.

Figure 12:
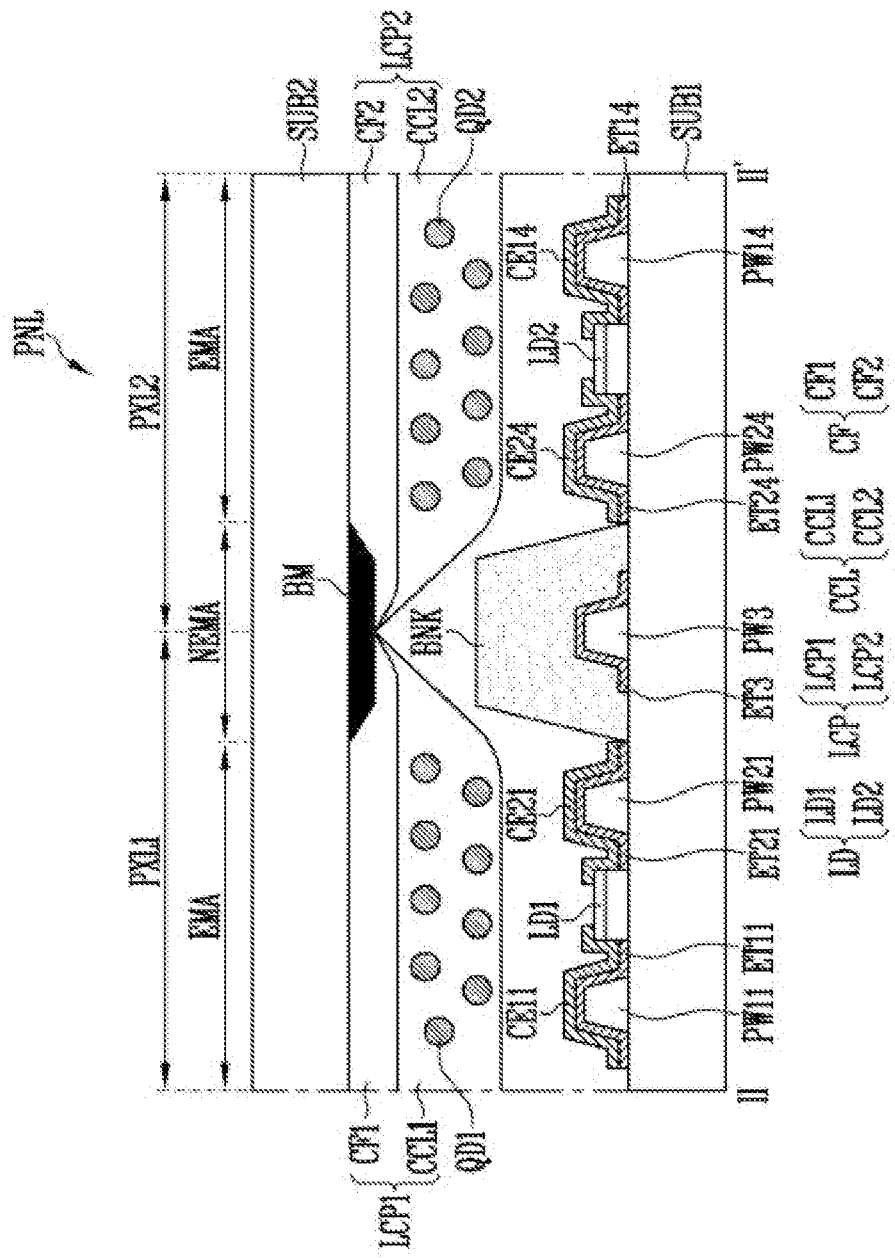
FIG. 12 is a sectional view schematically illustrating a display device in accordance with an embodiment of the disclosure, and is a sectional view showing an example of a cross-section corresponding to line II-II' of FIG. 10.

FIG. 12 is a sectional view schematically illustrating a display device in accordance with an embodiment of the disclosure, and is a sectional view showing an example of a cross-section corresponding to line II-II' of FIG. 10.

FIG. 12 illustrates an area in which some pixels PXL are disposed, in a display panel PNL formed by bonding upper and lower panels to each other. For convenience sake, FIG. 12 schematically illustrates the structure of the lower panel described in detail in FIGS. 6 to 8D and 11a to 11c, based on some components thereof, and detailed description thereof will be omitted.

Referring to FIGS. 4 and 12, the display device may include a second substrate SUB2 disposed on a surface of the first substrate SUB1 on which the first and second pixels PXL1 and PXL2 may be disposed, and a light conversion pattern layer LCP disposed on one surface of the second substrate SUB2 to face each of the first and second pixels PXL1 and PXL2.

In an embodiment, the second substrate SUB2 may be disposed over the first substrate SUB1 to cover a display area DA on which at least pixels PXL may be disposed. The second substrate SUB2 may form an upper substrate (e.g., an encapsulation substrate or a thin-film encapsulation layer) of the display panel PNL and/or a window component.

In an embodiment, the second substrate SUB2 may be a rigid substrate or a flexible substrate, and the material or properties thereof are not particularly limited. Furthermore, the second substrate SUB2 may be formed of the same material as that of the first substrate SUB1, or may be formed of material different from that of the first substrate SUB1.

In an embodiment, the light conversion pattern layer LCP may include a first light conversion pattern layer LCP1 disposed to face the first pixel PXL1, and a second light conversion pattern layer LCP2 disposed to face the second pixel PXL2. In an embodiment, at least some of the first and second light conversion pattern layers LCP1 and LCP2 may include a color conversion layer CCL and/or a color filter CF corresponding to a color.

For example, the first light conversion pattern layer LCP1 may include a first color conversion layer CCL1 including first color conversion particles corresponding to a first color, and a first color filter CF1 that allows the first color of light to selectively pass therethrough. Likewise, the second light conversion pattern layer LCP2 may include a second color conversion layer CCL2 including second color conversion particles corresponding to a second color, and a second color filter CF2 that allows the second color of light to selectively pass therethrough.

In an embodiment of the disclosure, the first and second light emitting elements LD1 and LD2 may emit light having the same color or different colors. A color conversion layer CCL may be disposed over at least some of the first and second pixels PXL1 and PXL2. For example, first and second color conversion layers CCL1 and CCL2 may be respectively disposed on the first and second pixels PXL1 and PXL2. Although not illustrated, color conversion layers having different colors respectively corresponding to three or more pixels adjacent to each other may be disposed. Consequently, the display device in accordance with an embodiment of the disclosure may display a full-color image.

In an embodiment, the first color conversion layer CCL1 may include first color conversion particles which convert the color of light emitted from the first light emitting elements LD1 to a first color of light. For example, in the case where the first light emitting elements LD1 are blue light emitting elements that emit blue light and the first pixel PXL1 is a red sub-pixel, the first color conversion layer CCL1 may include a first quantum dot QD1 which converts blue light emitted from the first light emitting elements LD1 to red light. For example, the first color conversion layer CCL1 may include a plurality of first quantum dots QD1 which are distributed in matrix material such as transparent resin. The first quantum dot QD1 may absorb blue light and shift the wavelength of light according to an energy transition, thus emitting red light having a wavelength ranging from about 620 nm to about 780 nm. In the case where the first pixel PXL1 is one of pixels having other colors, the first color conversion layer CCL1 may include a quantum dot corresponding to the color of the first pixel PXL1.

In an embodiment, the first color filter CF1 may be disposed between the first color conversion layer CCL1 and the second substrate SUB2 and include color filter material which allows the first color of light converted by the first color conversion layer CCL1 to selectively pass therethrough. For example, in the case where the first color conversion layer CCL1 includes the first quantum dot QD1, the first color filter CF1 may be a red color filter that allows red light to selectively pass therethrough.

In an embodiment, the second color conversion layer CCL2 may include second color conversion particles which convert the color of light emitted from the second light emitting elements LD2 to a second color of light. For example, in the case where the second light emitting elements LD2 are blue light emitting elements that emit blue light and the second pixel PXL2 is a green pixel, the second color conversion layer CCL2 may include a second quantum dot QD2 which converts blue light emitted from the second light emitting elements LD2 to green light. In the case where the second pixel PXL2 is one of pixels having other colors, the second color conversion layer CCL2 may include a quantum dot corresponding to the color of the second pixel PXL2.

Each of the first and second quantum dots may be in the form of a nanoparticle, a nanotube, a nanowire, nanofiber, a planar nanoparticle having a spherical shape, a pyramid shape, a multi-arm shape, or a cubic shape, but it is not limited thereto. In other words, the shapes of the first and second quantum dots may be changed in various ways.

In an embodiment, the second color filter CF2 may be disposed between the second color conversion layer CCL2 and the second substrate SUB2 and include color filter material which allows the second color of light converted by the second color conversion layer CCL2 to selectively pass therethrough. For example, in the case where the second color conversion layer CCL2 includes green quantum dots QD2, the second color filter CF2 may be a green color filter that allows green light to selectively pass therethrough.

In an embodiment, in at least one of the pixels PXL, a light scattering layer may be disposed between the pixel PXL and the color filter CF to substitute for the color conversion layer CCL.

In an embodiment, in the case where the light emitting elements LD are blue light emitting elements that emit blue light and the pixel PXL is a blue pixel, the light scattering layer may be selectively provided to efficiently use light emitted from the light emitting elements LD. The light scattering layer may include at least one kind of light scattering particles. For example, the light scattering layer may include light scattering particles such as $TiO_2$ or silica. For example, the light scattering layer may include a plurality of light scattering particles which are dispersed in matrix material such as transparent resin. In the disclosure, the material of the light scattering particles is not particularly limited, and the light scattering layer may be formed of various materials.

In an embodiment, a black matrix BM may be disposed between color filters CF. For example, the black matrix BM may be disposed on the second substrate SUB2 to overlap the bank BNK on the first substrate SUB1. The black matrix BM may correspond to the non-emission area NEMA.

In the foregoing embodiments, each pixel PXL using light emitting elements LD for emitting light of the same color and a display device including the same may be easily manufactured. Since the color conversion layer CCL may be disposed on at least some of the pixels PXL, a full-color pixel PXL and a display device including the same may be manufactured.

Figure 13:
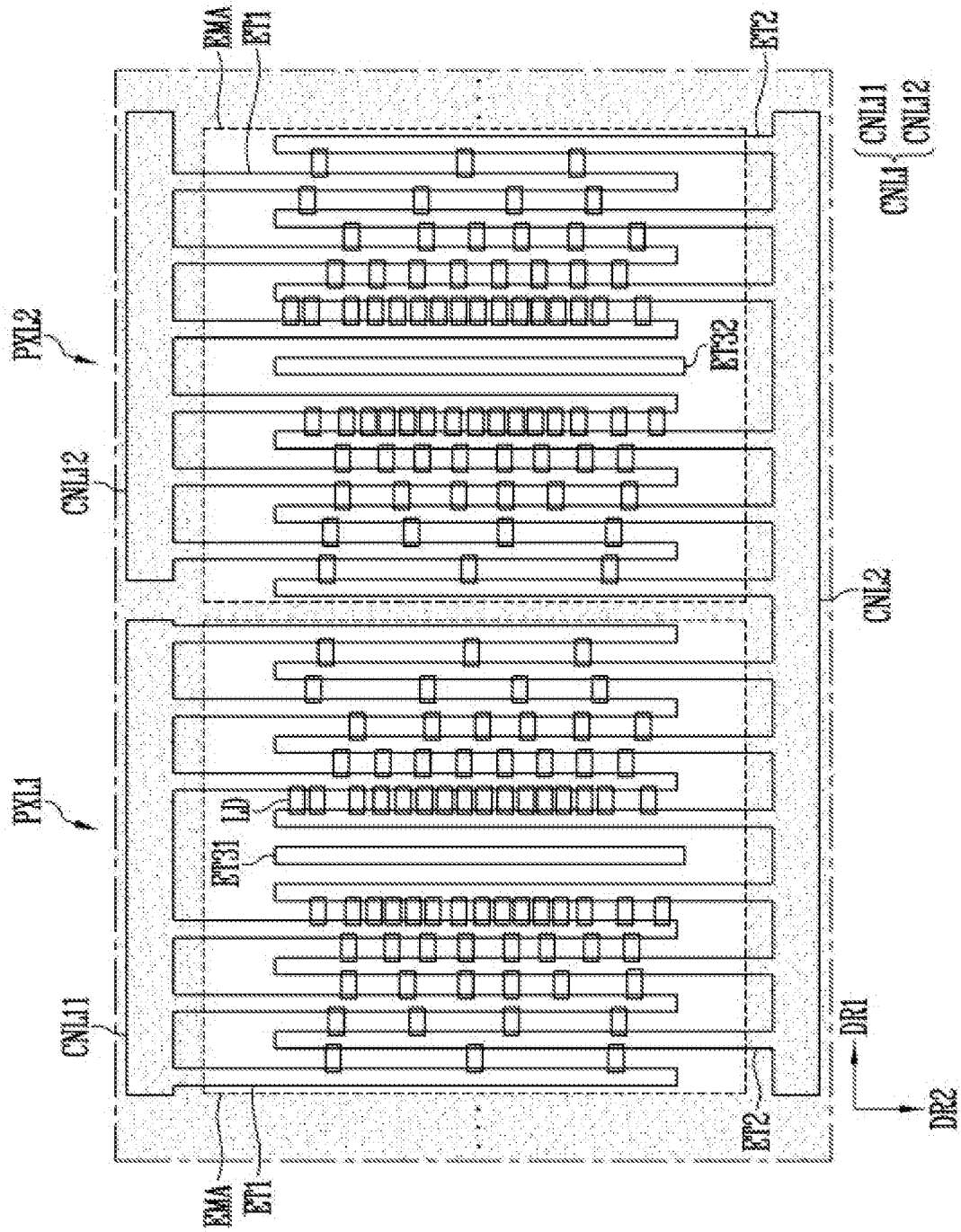
FIG. 13 is a diagram schematically illustrating an embodiment of a pixel included in a display device in accordance with an embodiment of the disclosure.

FIG. 13 is a diagram schematically illustrating an embodiment of a pixel included in a display device in accordance with an embodiment of the disclosure.

FIG. 13 illustrates a modification of the pixel PXL or the light emitting device in accordance with the embodiment of FIG. 10. Like reference numerals are used to designate the same or similar components as those of the above-mentioned embodiment, and detailed description thereof will be omitted. The configuration of the pixel PXL of FIG. 13, other than the disposition of the third electrode ET31 and ET32 and the position of the emission area EMA that defines the pixel PXL, may be substantially identical or similar to that of the pixel PXL of FIG. 10.

Referring to FIG. 13, each of the third electrodes ET31 and ET32 that float may be disposed in the emission area EMA of the corresponding pixel PXL.

In an embodiment, each pixel PXL may include twelve first electrodes ET1 and second electrodes ET2. Each of the third electrodes ET31 and ET32 may be disposed in a central portion of the corresponding first and second electrodes ET1 and ET2. For example, the first and second electrodes ET1 and ET2 in each pixel PXL may be substantially symmetrically disposed based on each corresponding third electrode ET31 and ET32.

For example, in the first pixel PXL1, some of the second electrodes ET2 may be respectively disposed to face the third electrode ET31 on opposite sides of the third electrode ET31. In the second pixel PXL2, some of the first electrodes ET1 may be respectively disposed adjacent to the third electrode ET32 on opposite sides of the third electrode ET32.

The light emitting elements LD adjacent to the third electrodes ET31 and ET32 that do not form an electric field may be moved to and aligned around other electrodes disposed around the third electrodes ET31 and ET32 during a process of applying the first alignment voltage and the second alignment voltage. Furthermore, since the electrodes to which the same alignment voltage may be applied may be disposed on opposite sides of the third electrodes ET31 and ET32, the arrangement of the light emitting elements LD may be focused on the electrode pairs of first and second electrodes ET1 and ET2 that are adjacent to the third electrodes ET31 and ET32. Hence, the disposition and emission of the light emitting elements LD may be focused on the central area of each of the pixels PXL.

Figure 14:
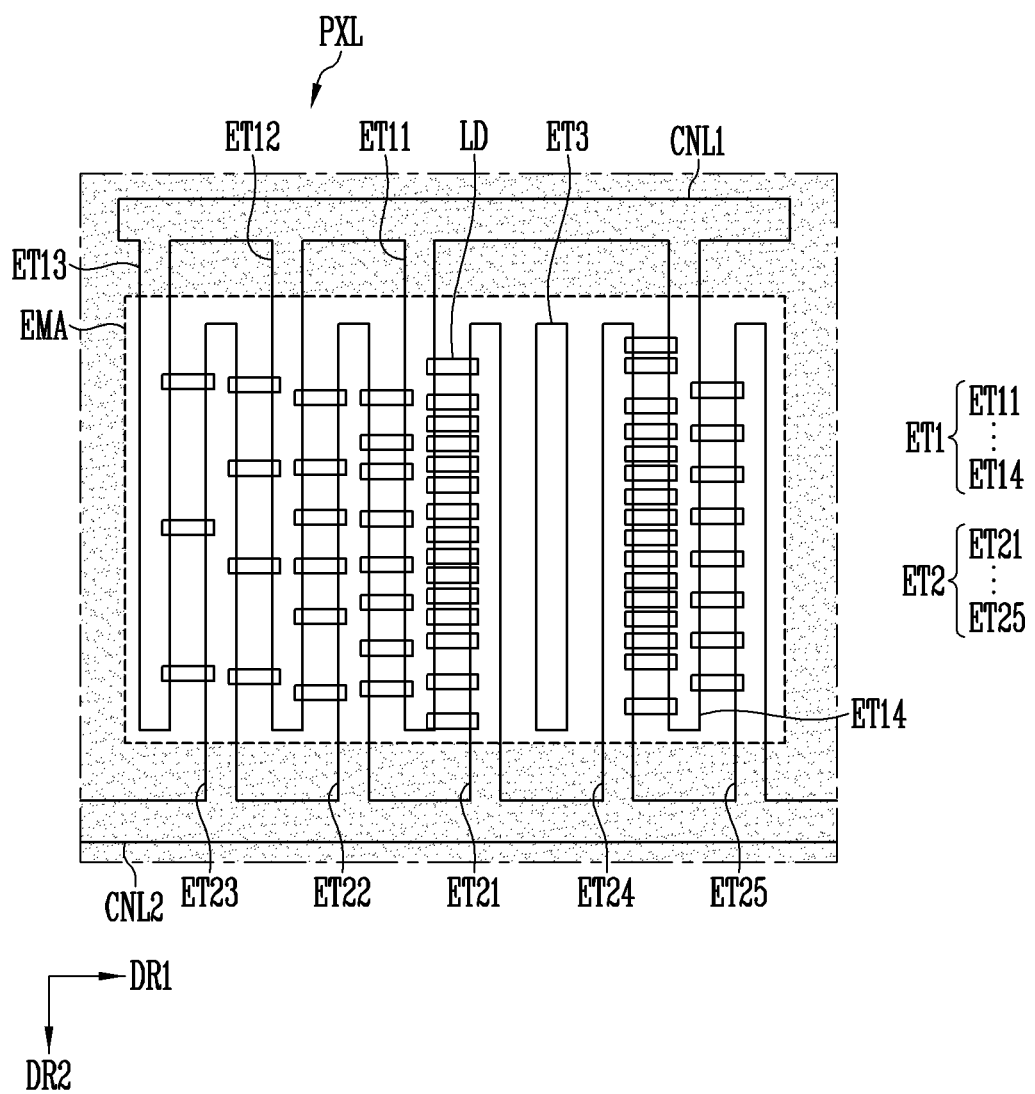
FIG. 14 is a diagram schematically illustrating an embodiment of a pixel included in a display device in accordance with an embodiment of the disclosure.

FIG. 14 is a diagram schematically illustrating an embodiment of a pixel included in a display device in accordance with an embodiment of the disclosure.

FIG. 14 illustrates a modification of the pixel PXL or the light emitting device in accordance with the embodiment of FIGS. 10 and 13. Like reference numerals are used to designate the same or similar components as those of the above-mentioned embodiment, and detailed description thereof will be omitted.

Referring to FIG. 14, the third electrode ET3 that floats may be disposed in the emission area EMA of each pixel PXL. Furthermore, the respective numbers of first and second electrodes ET1 and ET2 that are disposed on the opposite sides of the third electrode ET3 in the emission area EMA may differ from each other.

For example, as illustrated in FIG. 14, in the emission area EMA, six electrodes may be disposed on a first side (e.g., the left side) of the third electrode ET3, and three electrodes may be disposed on a second side (e.g., the right side) of the third electrode ET3. However, this is only for illustrative purposes, and the position of the third electrode ET3 and the numbers of first and second electrodes ET1 and ET2 disposed in the emission area EMA are not limited thereto. Furthermore, at least two third electrodes ET3 may be disposed in the emission area EMA.

The number of light emitting elements LD focused on the electrode pairs disposed on the opposite sides of the third electrode ET3 may be largest. As illustrated in FIG. 14, to focus the light emitting elements LD on the central portion of the emission area EMA, the third electrode ET3 may be disposed at a position displaced from the central portion of the emission area EMA.

As described above, the position at which the light emitting elements LD may be focused in the emission area EMA of the pixel PXL may be easily controlled by controlling the disposition position of the third electrode ET3. Therefore, a design change in the planar shape and the size of the pixel PXL may be facilitated. Furthermore, as the light quantity and luminance per unit surface area increases, the size of the pixel PXL may be reduced, and the high resolution may be easily embodied.

Figure 15:
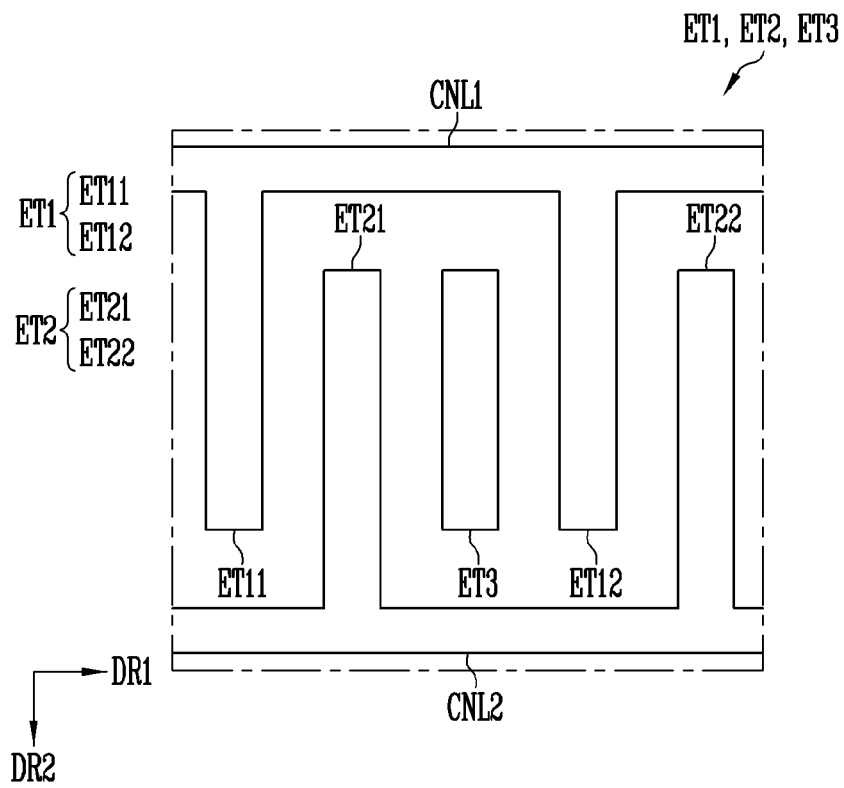
FIG. 15 is a plan view schematically illustrating an example of first to third electrodes included in the light emitting device in accordance with an embodiment of the disclosure.
Figure 16:
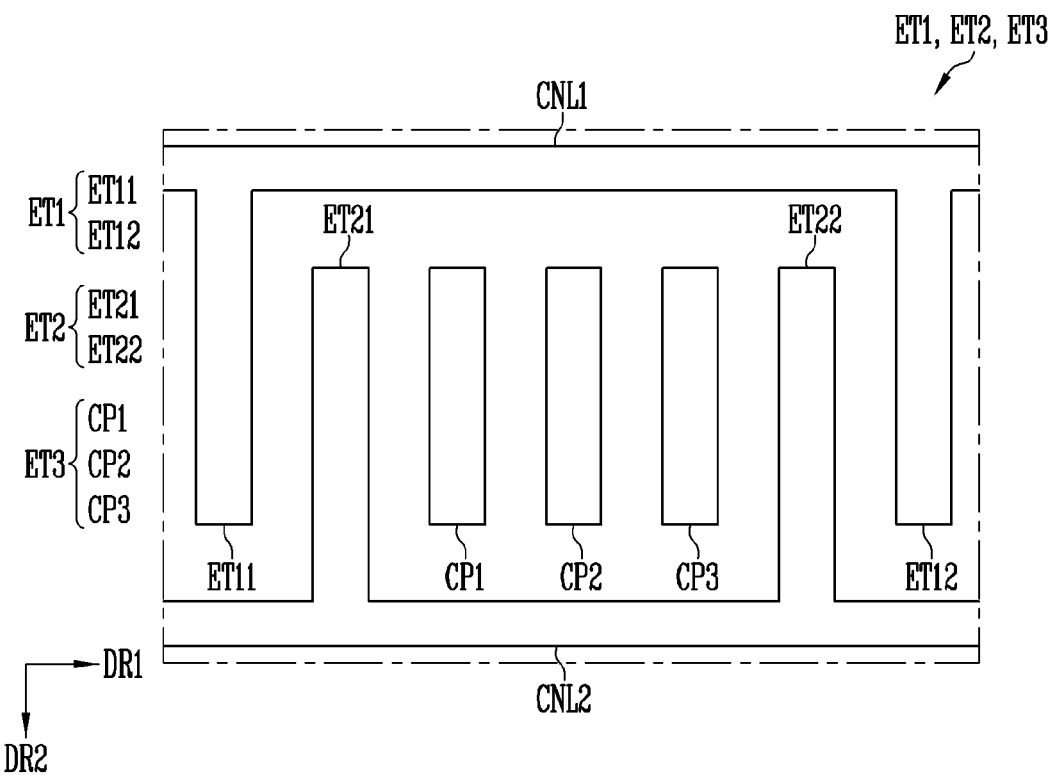
FIG. 16 is a plan view schematically illustrating an example of first to third electrodes included in the light emitting device in accordance with an embodiment of the disclosure.

FIGS. 15 and 16 are plan views schematically illustrating examples of the first to third electrodes included in the light emitting device in accordance with an embodiment of the disclosure.

FIGS. 15 and 16 illustrate a modification of the pixel PXL or the light emitting device in accordance with the embodiment of FIGS. 6 and 7, etc. Like reference numerals are used to designate the same or similar components as those of the above-mentioned embodiment, and detailed description thereof will be omitted.

Referring to FIGS. 15 and 16, the third electrode ET3 may be disposed at a position between the first and second electrodes ET1 and ET2 that may be alternately arranged.

In an embodiment, as illustrated in FIG. 15, one (e.g., ET21) of the second electrodes ET2 may be disposed to face a first side of the third electrode ET3, and one (e.g., ET12) of the first electrodes ET1 may be disposed to face a second side of the third electrode ET3. Valid light emitting elements are not disposed and aligned on the third electrode ET3 that does not form an electric field. The light emitting elements may be focused on the electrode pairs disposed on the opposite sides of the third electrode ET3.

As such, according to a process of forming an electrode pattern, different electrodes (e.g., ET21 and ET12) to which different alignment voltages are to be applied may be disposed on the opposite sides of the third electrode ET3. Therefore, a design change of the emission area EMA of the pixel PXL may be easily performed without being restricted by a process of patterning the first to third electrodes ET1, ET2, and ET3.

As illustrated in FIG. 16, the third electrode ET3 may include a plurality of conductive patterns CP1, CP2, and CP3 which may be successively disposed at positions spaced apart from each other in the first direction DR1. As the area in which an electric field may not be formed between the second electrodes ET21 and ET22 that face the third electrode ET3 may be increased, the number of light emitting elements aligned on the electrode pairs disposed on the opposite sides of the third electrode ET3 may be further increased. Hence, the density of light emitting elements in a narrower area may be increased, and the luminance per unit area may be increased.

As described above, in a light emitting device and a display device including the light emitting device in accordance with embodiments of the disclosure, an area in which the light emitting elements LD are intensively disposed in the emission area EMA may be easily controlled by controlling the disposition position of the third electrode ET3 that floats. Therefore, a design change in the planar shape and the size of the pixel PXL may be facilitated.

Furthermore, as the light quantity and luminance per unit surface area increases, the size of the pixel PXL may be reduced, and the high resolution may be easily embodied.

Embodiments of the disclosure are not limited to only a display device, and may be widely applied to other kinds of devices which need light sources.

While embodiments of the disclosure have been described above, those skilled in the art will appreciate that various modifications, additions and substitutions are possible, without departing from the scope and spirit of the disclosure claimed in the appended claims including equivalents thereof.

What is claimed is:
1. A light emitting device comprising:
    first electrodes and second electrodes that are spaced apart from each other in a first direction;
    light emitting elements electrically connected between adjacent first and second electrodes among the first and the second electrodes; and
    a third electrode spaced apart from the first electrodes and the second electrodes,
    wherein the third electrode is electrically separated from the first electrodes and the second electrodes.

2. The light emitting device according to claim 1, wherein the third electrode is an isolated electrode.

3. The light emitting device according to claim 1, wherein
the first electrodes and the second electrodes adjacent to each other form respective electrode pairs, and
a number of light emitting elements disposed on a first electrode pair most adjacent to the third electrode is greater than a number of light emitting elements disposed on a second electrode pair disposed farther from the third electrode than the first electrode pair.

4. The light emitting device according to claim 1, wherein a density of the light emitting elements is reduced in a direction away from the third electrode with respect to the first direction.

5. The light emitting device according to claim 1, wherein
at least one of the first electrodes is disposed to face a first side of the third electrode, and
at least another one of the first electrodes is disposed to face a second side of the third electrode that is opposite to the first side of the third electrode.

6. The light emitting device according to claim 1, wherein
at least one of the second electrodes is disposed to face a first side of the third electrode, and
at least another one of the second electrodes is disposed to face a second side of the third electrode that is opposite to the first side of the third electrode.

7. The light emitting device according to claim 1, wherein a width of the third electrode with respect to the first direction is greater than widths of the first electrodes and the second electrodes with respect to the first direction.

8. The light emitting device according to claim 1, wherein the third electrode comprises a plurality of conductive patterns successively disposed at positions spaced apart from each other in the first direction.

9. The light emitting device according to claim 1, wherein the first electrodes, the second electrodes, and the third electrode are formed of an identical conductive material and are disposed on an identical insulating layer.

10. A display device comprising:
a first pixel disposed in a display area and including an emission area,
wherein the first pixel comprises:
first electrodes and second electrodes that are disposed in the emission area and spaced apart from each other in a first direction;
light emitting elements electrically connected between adjacent first and second electrodes among the first and the second electrodes;
a first connection electrode connected to the first electrodes;
a second connection electrode connected to the second electrodes; and
a third electrode electrically separated from the first electrodes and the second electrodes, and spaced apart from the first electrodes and the second electrodes.

11. The display device according to claim 10, wherein the third electrode is an isolated electrode.

12. The display device according to claim 10, wherein
the first electrodes and the second electrodes adjacent to each other form respective electrode pairs, and
a number of light emitting elements disposed on a first electrode pair most adjacent to the third electrode is greater than a number of light emitting elements disposed on a second electrode pair disposed farther from the third electrode than the first electrode pair.

13. The display device according to claim 10, wherein a density of the light emitting elements is reduced in a direction away from the third electrode with respect to the first direction.

14. The display device according to claim 13, wherein
the third electrode is disposed in the emission area, and
the first and the second electrodes are disposed in a symmetrical shape based on the third electrode.

15. The display device according to claim 13, wherein
the third electrode is disposed in the emission area, and
a number of the first and the second electrodes that are disposed on a first side of the third electrode differs from a number of the first and the second electrodes disposed on a second side of the third electrode.

16. The display device according to claim 10, wherein the third electrode is disposed on a side of a non-emission area that surrounds the emission area of the first pixel.

17. The display device according to claim 16, further comprising a bank disposed in the non-emission area to surround the first pixel, and disposed on the third electrode.

18. The display device according to claim 16, further comprising a second pixel having a structure identical with a structure of the first pixel and disposed adjacent to the third electrode, wherein
the first connection electrodes of the first and the second pixels are separated from each other between the first and the second pixels, and
the second connection electrodes of the first and the second pixels are integrally connected with each other.

19. The display device according to claim 18, wherein a density at which the light emitting elements of each of the first and the second pixels are disposed increases from a central portion of the corresponding emission area toward the third electrode.

20. The display device according to claim 10, wherein the first electrode, the second electrode, and the third electrode are formed of an identical conductive material and are disposed on an identical insulating layer.

* * * * *